United States Patent
Lee et al.

(10) Patent No.: US 9,735,351 B2
(45) Date of Patent: Aug. 15, 2017

(54) MAGNETO-RESISTANCE RANDOM ACCESS MEMORY DEVICE AND METHOD OF MANUFACTURING THE SAME

(71) Applicants: Wonjun Lee, Seoul (KR); Inseak Hwang, Suwon-si (KR); Yongsun Ko, Suwon-si (KR); Changkyu Lee, Seoul (KR); Jinhye Bae, Suwon-si (KR); Hyunchul Shin, Seoul (KR); Shinhee Han, Seongnam-si (KR); Yoonsung Han, Seoul (KR)

(72) Inventors: Wonjun Lee, Seoul (KR); Inseak Hwang, Suwon-si (KR); Yongsun Ko, Suwon-si (KR); Changkyu Lee, Seoul (KR); Jinhye Bae, Suwon-si (KR); Hyunchul Shin, Seoul (KR); Shinhee Han, Seongnam-si (KR); Yoonsung Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/203,008

(22) Filed: Jul. 6, 2016

(65) Prior Publication Data

US 2017/0092850 A1    Mar. 30, 2017

(30) Foreign Application Priority Data

Sep. 30, 2015 (KR) .................. 10-2015-0137929

(51) Int. Cl.
*H01L 21/00* (2006.01)
*H01L 43/12* (2006.01)
(Continued)

(52) U.S. Cl.
CPC .............. *H01L 43/12* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

2002/0027291 A1   3/2002  Yokoyama
2003/0180968 A1*  9/2003  Nallan .................. H01L 23/564
                                                  438/3
(Continued)

FOREIGN PATENT DOCUMENTS

KR   10-2003-0002120   1/2003

OTHER PUBLICATIONS

M. Sutcu et al., "Influence of crystallographic orientation on hydration of MgO single crystals", Ceramics INternational, 35 (2009), pp. 2571-2576.

*Primary Examiner* — Angel Roman
(74) *Attorney, Agent, or Firm* — Harness, Dickey & Pierce P.L.C.

(57) ABSTRACT

Manufacturing a MRAM device may include removing etch residues from a magnetic tunnel junction (MTJ) pattern in the presence of an atmosphere. The removing may include applying a cleaning solution to one or more surfaces of the MTJ pattern. Manufacturing the MRAM device may include removing an oxide layer based on sputter etching of the MTJ pattern. The etch residues may be removed such that the oxide layer is formed. Removing the etch residues may include applying a cleaning solution to the MTJ pattern. The etch residues may be removed in the presence of an atmosphere. The MTJ pattern may be formed based on patterning (Continued)

an MTJ layer in a vacuum state such that the etch residues are formed on a surface of the MTJ pattern.

20 Claims, 23 Drawing Sheets

(51) Int. Cl.
  *H01L 43/08* (2006.01)
  *H01L 43/02* (2006.01)
  *H01L 43/10* (2006.01)

(56) References Cited

U.S. PATENT DOCUMENTS

| | | | |
|---|---|---|---|
| 2003/0181056 A1* | 9/2003 | Kumar | B82Y 25/00 438/710 |
| 2004/0026369 A1* | 2/2004 | Ying | B82Y 40/00 216/63 |
| 2004/0029393 A1* | 2/2004 | Ying | B82Y 25/00 438/745 |
| 2004/0043620 A1* | 3/2004 | Ying | B82Y 25/00 438/710 |
| 2010/0200900 A1* | 8/2010 | Iwayama | B82Y 25/00 257/295 |
| 2010/0264501 A1* | 10/2010 | Furuta | B82Y 10/00 257/421 |
| 2013/0034917 A1* | 2/2013 | Lee | H01L 43/12 438/3 |
| 2014/0087483 A1* | 3/2014 | Ohsawa | H01J 37/08 438/3 |
| 2014/0227804 A1 | 8/2014 | Hsu et al. | |
| 2014/0287591 A1* | 9/2014 | Nishimura | H01L 43/12 438/714 |
| 2015/0017741 A1 | 1/2015 | Fujita et al. | |
| 2015/0092482 A1* | 4/2015 | Ha | H01L 45/06 365/163 |

* cited by examiner

MAGNETO-RESISTANCE RANDOM ACCESS MEMORY DEVICE AND METHOD OF MANUFACTURING THE SAME

CROSS-REFERENCE TO RELATED APPLICATION

This application claims priority under 35 U.S.C. §119 to Korean Patent Application No. 10-2015-0137929 filed on Sep. 30, 2015, the disclosure of which is hereby incorporated by reference in its entirety.

BACKGROUND

Technical Field

Inventive concepts relate to a magneto-resistance random access memory device and a method of manufacturing the same.

Description of Related Art

Magneto-resistance random access memory (MRAM) devices are non-volatile memory devices that read and/or write using a magnetic tunnel junction (MTJ) pattern having two magnetic substances and an insulating layer interposed between thereof. In a process of manufacturing the MRAM device, the MTJ pattern is patterned by performing a sputter etching process. Etch residues may be generated based on the patterning of the MTJ pattern. The generated etch residues may be re-deposited on sidewalls of the MTJ pattern. The re-deposited etch residues may cause an electrical short between the two magnetic substances. Accordingly, the re-deposited etch residues may be removed.

In some cases, a method that makes the etch residues into an oxide insulator by performing an oxidation process may be used to remove the etch residues. In some cases, an electrical short may occur, despite the oxidation process, due to non-oxide etch residues and a non-uniformity of the amounts of the etch residue. In some cases, a magnetic characteristic of the MRAM device is degraded based on the oxidation process, as the magnetic substances may be at least partially oxidized by the oxidation process.

SUMMARY

Example embodiments of inventive concepts provide a magneto-resistance random access memory (MRAM) device capable of limiting and/or preventing an electrical short of a magnetic tunnel junction (MTJ) pattern.

Example embodiments of inventive concepts provide a MRAM device capable of limiting and/or preventing a degradation of a magnetic property of a MTJ pattern.

Example embodiments of inventive concepts provide methods of manufacturing the MRAM device.

The technical objectives of inventive concepts are not limited to the above disclosure, and other objectives may become apparent to those of ordinary skill in the art based on the following descriptions.

According to some example embodiments of the inventive concepts, a method of manufacturing a magneto-resistance random access memory (MRAM) device may include forming magnetic tunnel junction (MTJ) layers on a substrate; patterning the MTJ layers to form a MTJ pattern such that etch residues are formed on a side surface of the MTJ pattern based on the patterning; removing the etch residues such that an oxide layer is formed on the side surface of the MTJ pattern; and removing the oxide layer based on sputter etching of the MTJ pattern.

According to some example embodiments of the inventive concepts, a method of manufacturing a magneto-resistance random access memory (MRAM) device may include forming a lower electrode and a lower interlayer insulating layer on a substrate, the lower interlayer insulating layer surrounding a side surface of the lower electrode; forming magnetic tunnel junction (MTJ) layers and a metal mask layer on the lower electrode and the lower interlayer insulating layer; patterning the metal mask layer to form a metal mask pattern; selectively etching the MTJ layers to form a magnetic tunnel junction (MTJ) pattern in a vacuum state based on sputter etching of the MTJ layers such that etch residues are formed on one or more surfaces of the MTJ pattern and the metal mask pattern and at least one upper surface of the lower interlayer layer is exposed; removing the etch residues based on applying a cleaning solution to the MTJ pattern at atmospheric pressure such that an oxide layer and a hydroxide layer are formed on the one or more surfaces of the MTJ pattern and the metal mask pattern; removing the oxide layer and the hydroxide layer based on sputter etching the MTJ pattern in the vacuum state; forming a conformal liner on the exposed upper surface of the lower interlayer insulating layer, a side surface of the MTJ pattern, a side surface of the metal mask pattern, and an upper surface of the metal mask pattern; forming an upper interlayer insulating layer on the conformal liner; and forming an upper electrode on the metal mask pattern, the upper electrode extending through the upper interlayer insulating layer.

According to some example embodiments of the inventive concepts, a magneto-resistance random access memory (MRAM) device may include a substrate having a lower electrode; a magnetic tunnel junction (MTJ) pattern on the substrate; a metal mask pattern on the MTJ pattern, the metal mask pattern having at least one side surface, the at least one side surface having a concave curvature towards an exterior of the metal mask pattern; and an upper electrode on the metal mask pattern.

According to some example embodiments of the inventive concepts, a magneto-resistance random access memory (MRAM) device may include a substrate; a lower electrode and a lower interlayer insulating layer, the lower interlayer insulating layer being configured to cover a side surface of the lower electrode; a magnetic tunnel junction (MTJ) pattern on the lower electrode and the lower interlayer insulating layer, the MTJ pattern including a side surface, the side surface; a metal mask pattern on the MTJ pattern, the metal mask pattern including a side surface, the side surface of the metal mask pattern having a concave curvature towards an exterior of the metal mask pattern; an upper electrode on the metal mask pattern, the upper electrode including a side surface; a conformal liner on an upper surface of the lower interlayer insulating layer, the side surface of the MTJ pattern, the side surface of the metal mask pattern, and the side surface of the upper electrode; and an upper interlayer insulating layer covering the side surface of the MTJ pattern, the side surface of the metal mask pattern, and the side surface of the upper electrode.

According to some example embodiments of the inventive concepts, a method of manufacturing a magneto-resistance random access memory (MRAM) device may include applying a cleaning solution to a magnetic tunnel junction (MTJ) pattern in a presence of an atmosphere to remove an etch residue from a side surface of the MTJ pattern; and patterning the MTJ pattern to remove an oxide layer from the side surface of the MTJ pattern.

Details of other embodiments are included in the detailed description and drawings.

BRIEF DESCRIPTION OF THE DRAWINGS

The foregoing and other features and advantages of inventive concepts will be apparent from the more particular description of preferred embodiments of inventive concepts, as illustrated in the accompanying drawings in which like reference numerals denote the same respective parts throughout the different views. The drawings are not necessarily to scale, emphasis instead being placed upon illustrating the principles of inventive concepts. In the drawings.

DETAILED DESCRIPTION OF EXAMPLE EMBODIMENTS

Figure 1:
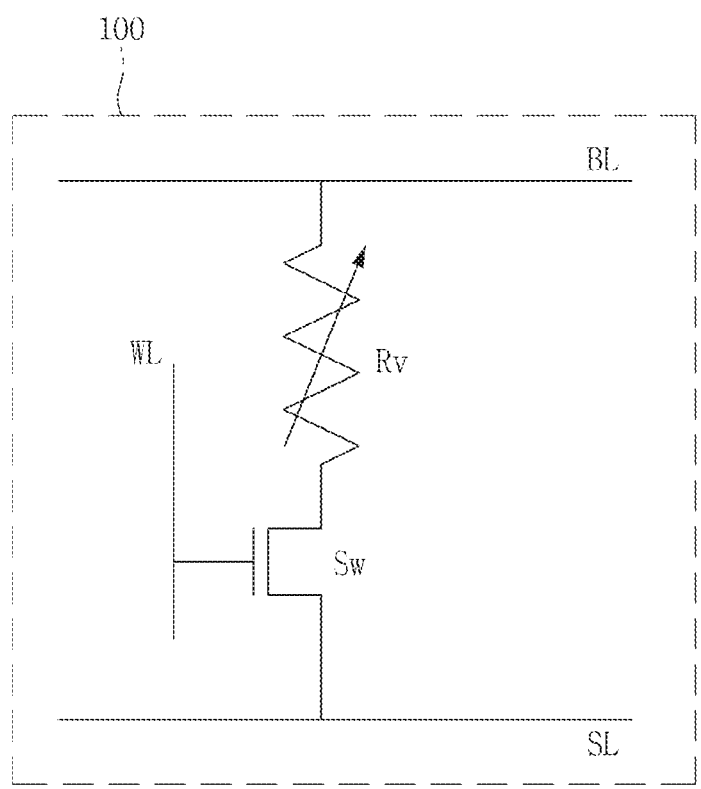
FIG. 1 is an equivalent circuit diagram of a unit cell of a magneto-resistance random access memory (MRAM) device according to some example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

The terminology used herein to describe embodiments of inventive concepts is not intended to limit the scope of inventive concepts. The articles "a," "an," and "the" are singular in that they have a single referent; however, the use of the singular form in the present document should not preclude the presence of more than one referent. In other words, elements of inventive concepts referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected to, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification.

Spatially relative terms, including "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation. The device may be otherwise oriented (rotated 90 degrees or at other orientations) and the spatially relative descriptors used herein interpreted accordingly.

Embodiments are described herein with reference to cross-sectional and/or planar illustrations that are schematic illustrations of idealized embodiments and intermediate structures. In the drawings, the sizes and relative sizes of layers and regions may be exaggerated for clarity. Therefore, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Like numerals refer to like elements throughout the specification. Accordingly, the same numerals and similar numerals may be described with reference to other drawings, even if not specifically shown in a corresponding drawing. Further, when a numeral is not marked in a drawing, the numeral may be described with reference to other drawings.

Unless otherwise defined, all terms (including technical and scientific terms) used herein have the same meaning as commonly understood by one of ordinary skill in the art to which example embodiments belong. It will be further understood that terms, including those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry including, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, including one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, including random access memory (RAM), read only memory (ROM), a permanent mass storage device (including a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, including a computer processing device, may run an operating system (OS) and one or more software applications that run on the OS. The computer processing device also may access, store, manipulate, process, and create data in response to execution of the software. For simplicity, one or more example embodiments may be exemplified as one computer processing device;

however, one skilled in the art will appreciate that a hardware device may include multiple processing elements and multiple types of processing elements. For example, a hardware device may include multiple processors or a processor and a controller. In addition, other processing configurations are possible, including parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components including the described system, architecture, devices, circuit, and the like, may be connected or combined to be different from the above-described methods, or results may be appropriately achieved by other components or equivalents.

FIG. 1 is an equivalent circuit diagram of a unit cell of a magneto-resistance random access memory (MRAM) device 100 according to some example embodiments of inventive concepts.

Referring to FIG. 1, the MRAM device 100 according to some example embodiments of inventive concepts may include a source line SL, a switching device Sw, a word line WL, a variable resistor Rv, and a bit line BL. The switching device Sw may include a transistor. In some example embodiments, the switching device Sw may include a diode. The switching device may be activated (i.e., "turned on") based on a voltage being applied to the word line WL. If and/or when the switching device Sw is activated, a current may be supplied to the bit line BL through the variable resistor Rv from the source line SL. According to a resistance value of the variable resistor Rv, a magnitude of the current supplied to the bit line BL may be changed. The magnitude of the current may refer to a logic "1" or logic "0."

Figure 2A:
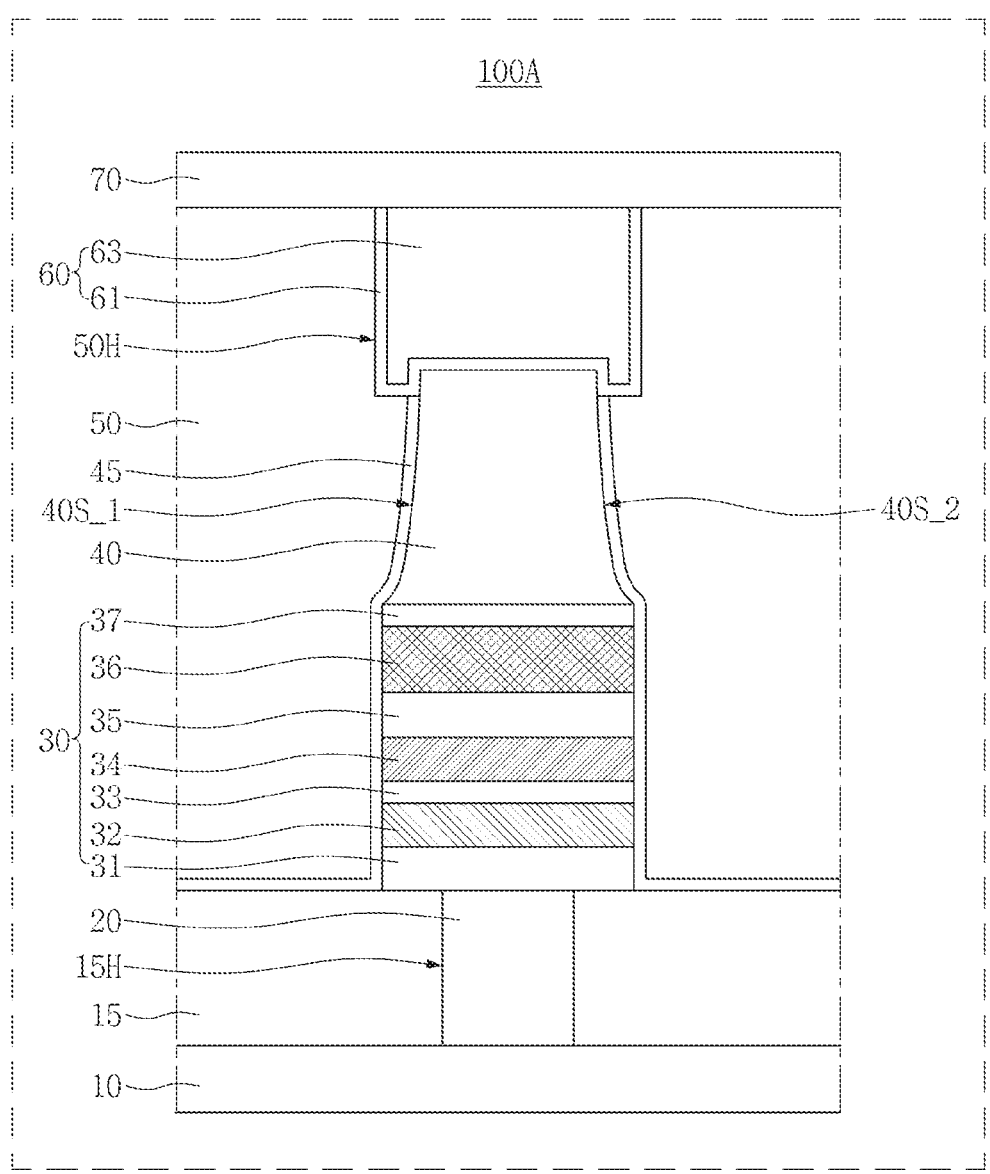
FIG. 2A, FIG. 2B, and FIG. 2C illustrate longitudinal cross-sectional views for describing MRAM devices according to some example embodiments of inventive concepts.

FIG. 2A illustrates a longitudinal cross-sectional view schematically illustrating a MRAM device 100A according to some example embodiments of inventive concepts.

Referring to FIG. 2A, a MRAM device 100A according to some example embodiments of inventive concepts may include a substrate 10, a lower interlayer insulating layer 15, a lower electrode 20, a magnetic tunnel junction (MTJ) pattern 30, a metal mask pattern 40, a liner 45, an upper interlayer insulating layer 50, an upper electrode 60, and an interconnection layer 70.

The substrate 10 may include a silicon wafer, a silicon-on-insulator (SOI) wafer, or a semiconductor wafer having an epitaxial growth layer formed of silicon germanium (SiGe).

The lower interlayer insulating layer 15 may be formed on the substrate 10. The lower interlayer insulating layer 15 may include silicon oxide, silicon nitride, or silicon oxynitride. For example, the lower interlayer insulating layer 15 may include boro-phospho-silicate glass (BPSG), toten silazene (TOZE), undoped silicate glass (USG), spin-on glass (SOG), a flowable oxide (FOX), tetraethylorthosilicate (TEOS), or a high density plasma (HDP) oxide. The lower interlayer insulating layer 15 may include a lower electrode hole 15H exposing a surface of the substrate 10.

The lower electrode 20 may be disposed in the lower electrode hole 15H of the lower interlayer insulating layer 15. An upper surface of the lower electrode 20 may be substantially coplanar with an upper surface of the lower interlayer insulating layer 15. The lower electrode 20 may include a conductor including poly-silicon, a metal, a metal alloy, or a metal silicide.

The MTJ pattern 30 may include a seed pattern 31, a lower pinned magnetic pattern 32, a spacer pattern 33, an upper pinned magnetic pattern 34, a tunneling barrier pattern 35, a free magnetic pattern 36, and a capping pattern 37.

The seed pattern 31 may be on the lower electrode 20 and the lower interlayer insulating layer 15. The seed pattern 31 may be in direct contact with the lower electrode 20. The seed pattern 31 may provide a crystallizability or crystal orientation of the lower pinned magnetic pattern 32. The seed pattern 31 may be a single layer or bilayer. For example, the seed pattern 31 may be a single layer having tantalum (Ta) or ruthenium (Ru). In some example embodiments, the seed pattern 31 may be a bilayer including a lower Tantalum (Ta) layer and an upper Ruthenium (Ru) layer stacked on the lower Ta layer.

The lower pinned magnetic pattern 32 may be on the seed pattern 31. In some example embodiments, a magnetization direction of the lower pinned magnetic pattern 32 may be perpendicular to a surface of the substrate 10. The magnetization direction of the lower pinned magnetic pattern 32 may be fixed. The magnetization direction of the lower pinned magnetic pattern 32 may not be influenced by an external magnetic field. In other words, the magnetization direction of the lower pinned magnetic pattern 32 may be at least partially resistant to being changed by a magnetic field formed between the lower electrode 20 and the upper electrode 60. The lower pinned magnetic pattern 32 may include a CoPt layer, a CoPd layer, an alloy layer of CoPt and CoPd, or a multilayer in which CoPt layers and CoPd layers are alternately stacked.

The spacer pattern 33 may be on the lower pinned magnetic pattern 32. The spacer pattern 33 may include an anti-ferromagnetic metal including Ru.

The upper pinned magnetic pattern 34 may be on the spacer pattern 33. A magnetization direction of the upper pinned magnetic pattern 34 may be perpendicular to the surface of the substrate 10. The magnetization direction of the upper pinned magnetic pattern 34 may be fixed without being influenced by an external magnetic field. In other words, the magnetization direction of the upper pinned magnetic pattern 34 may not be changed by the magnetic field formed between the lower electrode 20 and the upper electrode 60. For example, the upper pinned magnetic pattern 34 may include CoFeB. In some example embodiments, the upper pinned magnetic pattern 34 may include a multilayer including a stacked layer of CoFeB/Ta/CoFeB. In some example embodiments, the upper pinned magnetic pattern 34 may include a multilayer including a stacked layer of Co/B/CoFeB or a layer of Co/W/CoFeB/W/CoFeB.

The tunneling barrier pattern 35 may be on the upper pinned magnetic pattern 34. The tunneling barrier pattern 35 may provide a crystallizability or crystal orientation of the upper pinned magnetic pattern 34. For example, the upper pinned magnetic pattern 34 may have the same crystalline structure as the tunneling barrier pattern 35. The tunneling barrier pattern 35 may include MgO.

The free magnetic pattern 36 may be on the tunneling barrier pattern 35. The free magnetic pattern 36 may have a vertical magnetization characteristic. A magnetization direction of the free magnetic pattern 36 may be changed. In other words, the magnetization direction of the free magnetic pattern 36 may be changed by the magnetic field formed between the lower electrode 20 and the upper electrode 60. A crystalline structure of the free magnetic pattern 36 may be influenced by the tunneling barrier pattern 35. For example, the free magnetic pattern 36 may have the same crystalline structure as the tunneling barrier pattern 35. The free magnetic pattern 36 may include a CoFeB layer or a stacked layer of CoFeB/W/CoFeB.

The capping pattern 37 may be on the free magnetic pattern 36. The capping pattern 37 may include a metal, including Cu, Ta, Al, Au, Ti, or Ru, or a metal nitride including TiN or TaN. For example, the capping pattern 37 may include Ru. In some example embodiments, the capping pattern 37 may be a multilayer.

Side surfaces of the seed pattern 31, the lower pinned magnetic pattern 32, the spacer pattern 33, the upper pinned magnetic pattern 34, the tunneling barrier pattern 35, the free magnetic pattern 36, and the capping pattern 37 may be vertically aligned. Accordingly, side surfaces of the MTJ pattern 30 may have straight profiles perpendicular to the surface of the substrate 10, such that the MTJ pattern 30 has a straight line profile perpendicular to the surface of the substrate 10. The MTJ pattern 30 may be the variable resistor Rv shown in FIG. 1.

The metal mask pattern 40 may be on the capping pattern 37. The metal mask pattern 40 may include W, Ta, Ti, Ru, or TiN.

Side surfaces of the metal mask pattern 40 may have curve profiles. For example, the side surfaces of the metal mask pattern 40 may have curve profiles bent toward an outside thereof. Lower portions of the side surfaces of the metal mask pattern 40 may have a relatively large curvature, and upper portions of the side surfaces of the metal mask pattern 40 may have a relatively small curvature.

The side surfaces of the metal mask pattern 40 may have a first side surface 40S_1 and a second side surface 40S_2 opposite the first side surface 40S_1. A distance between the first side surface 40S_1 and the second side surface 40S_2 of the metal mask pattern 40 increases in a direction toward the capping pattern 37, and decreases in a direction away from the capping pattern 37. In other words, a horizontal width of the metal mask pattern 40 may be gradually reduced from a lower portion of the metal mask pattern 40 to an upper portion of the metal mask pattern 40.

The liner 45 may be conformally formed on an upper surface of the lower interlayer insulating layer 15, the side surfaces of the MTJ pattern 30, and the side surfaces of the metal mask pattern 40. The liner 45 may not be formed on upper ends of the side surfaces of the metal mask pattern 40. In other words, an upper surface of the liner 45 may be located at a lower level than an upper surface of the metal mask pattern 40. The liner 45 may include silicon oxide, silicon nitride, silicon oxynitride, or a metal oxide including aluminum oxide.

The upper interlayer insulating layer 50 may be formed on the liner 45 to cover the metal mask pattern 40 and the MTJ pattern 30. An upper surface of the upper interlayer insulating layer 50 may be located at a higher level than the upper surface of the metal mask pattern 40. The upper interlayer insulating layer 50 may include an upper electrode hole 50H exposing the upper and side surfaces of the metal mask pattern 40 and the upper surface of the liner 45. The upper ends of the metal mask pattern 40 may be located at a higher level than a bottom surface of the upper electrode hole 50H. The upper interlayer insulating layer 50 may include silicon oxide or silicon nitride.

The upper electrode 60 may be disposed in the upper electrode hole 50H of the upper interlayer insulating layer 50. The upper electrode 60 may include an upper electrode barrier pattern 61 and the upper electrode metal pattern 63.

The upper electrode barrier pattern 61 may be conformally formed on the bottom surface and inner sidewalls of the upper electrode hole 50H. The upper electrode barrier pattern 61 may be in direct contact with the upper and side surfaces of the metal mask pattern 40 and the upper surface of the liner 45 exposed through the bottom surface of the upper electrode hole 50H. The upper electrode barrier pattern 61 may include Ti, Ta, TiN, TaN, or another barrier metal or a metal compound.

The upper electrode metal pattern 63 may be formed on the upper electrode barrier pattern 61 to fill the upper electrode hole 50H. An upper surface of the upper electrode metal pattern 63, an upper surface of the upper electrode barrier pattern 61, and the upper surface of the upper interlayer insulating layer 50 may be substantially coplanar. The upper electrode metal pattern 63 may include a metal including W or Cu.

A horizontal width of the electrode 60 may be greater than a horizontal width of an upper portion of the metal mask pattern 40.

The interconnection layer 70 may be on the upper interlayer insulating layer 50 and the upper electrode 60. The interconnection layer 70 may be in direct contact with the upper electrode 60. The interconnection layer 70 may extend in a lateral direction. The interconnection layer 70 may be a bit line BL shown in FIG. 1. The interconnection layer 70 may include a metal including W or Cu.

In some example embodiments, the MRAM device 100A may further include an isolation region defining an active region in the substrate 10, a cell transistor formed on the active region, a source contact plug, a drain contact plug, a source interconnection, and a lower electrode pad.

The cell transistor may include a gate structure, and source/drain areas formed on both sides of the gate structure. The cell transistor may be the switching device Sw shown in FIG. 1. The gate structure may be connected to the word line WL shown in FIG. 1.

The gate structure may include a gate insulating layer directly formed on a surface of the active region, a gate electrode on the gate insulating layer, a gate capping layer on the gate electrode, and a gate spacer formed on side surfaces of the gate insulating, the gate electrode, and the gate capping layer. The gate insulating layer may include silicon oxide (SiO2), or a metal oxide including hafnium oxide (HfO). The gate electrode may include a conductor including poly-silicon, a metal, a metal alloy, or a metal silicide. The gate capping layer may include an insulating material denser and solider than silicon oxide (SiO2) including silicon nitride (SiN). The gate spacer may include silicon nitride (SiN), silicon boronitride (SiBN), or silicon carbonitride (SiCN).

The source/drain areas may be formed in the active region located at both sides of the gate structure. The source/drain areas may include dopants including boron (B), phosphorous (P), and/or arsenic (As) to have conductivity.

The source contact plug may be in direct contact with the source area, and the drain contact plug may be in direct contact with the drain area. The source contact plug and the drain contact plug may each include a conductor including poly-silicon, a metal, a metal alloy, or a metal silicide.

The source interconnection may be on the source contact plug. The source interconnection may be the source line SL shown in FIG. 1. The source interconnection may extend in a lateral direction, and have a line shape in a top view. The source interconnection may include a conductor including poly-silicon, a metal, a metal alloy, or a metal silicide.

The lower electrode pad may be on the drain contact plug. The lower electrode pad may be connected to the lower electrode 20. The lower electrode pad may have a circular shape, a rectangular shape, or a polygonal shape in a top view. The lower electrode pad may be disposed at the same level as the source interconnection. The lower electrode pad may include a conductor including poly-silicon, a metal, a metal alloy, or a metal silicide.

Figure 2B:
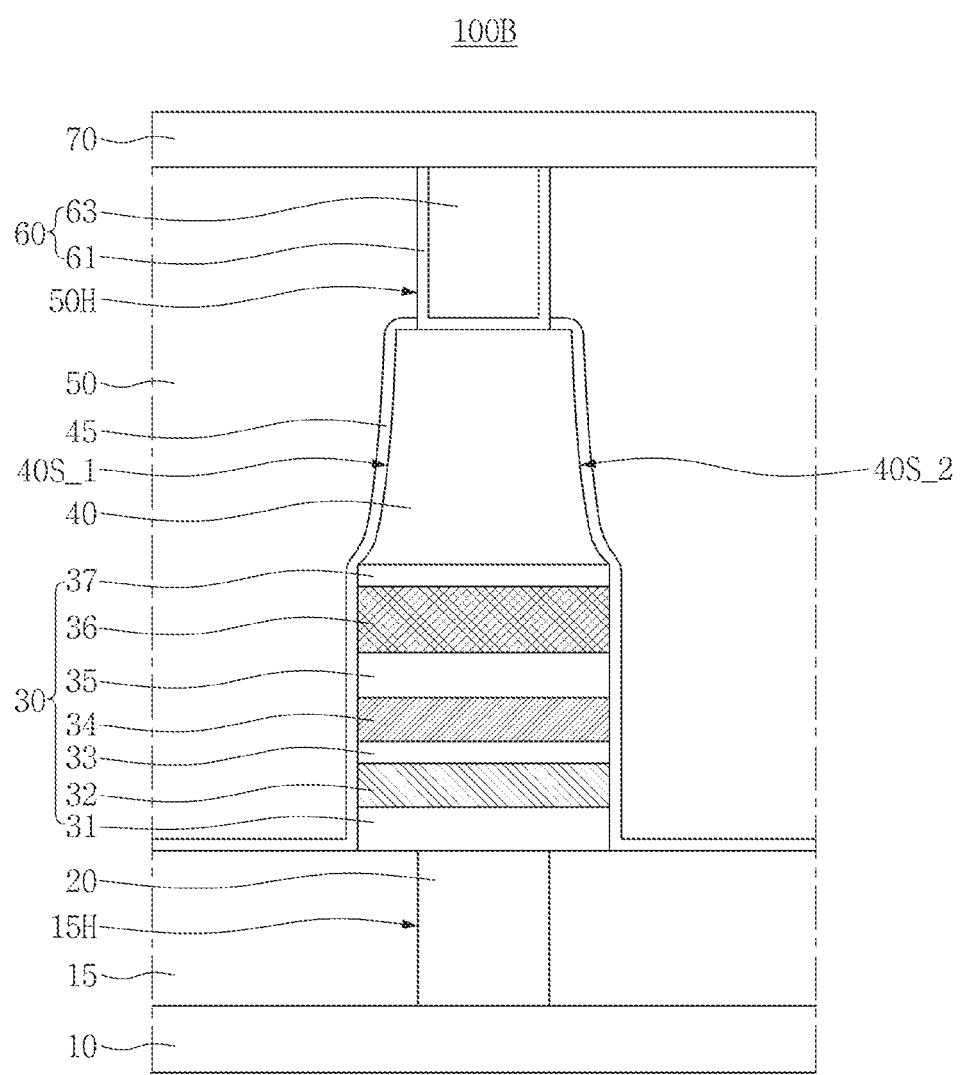

FIG. 2B illustrates a longitudinal cross-sectional view schematically illustrating a MRAM device according to some example embodiments of inventive concepts. In some example embodiments of inventive concepts, detailed descriptions of the same content as those of the above-described embodiments will be omitted.

Referring to FIG. 2B, in a MRAM device 100B according to some example embodiments of inventive concepts, a horizontal width of an upper electrode 60 may be smaller than a horizontal width of an upper portion of a metal mask pattern 40. An upper surface of the metal mask pattern 40 may be exposed through a bottom surface of an upper electrode hole 50H, and a liner 45 may be exposed through lower ends of inner sidewalls of the upper electrode hole 50H. Accordingly, a part of the upper surface of the metal mask pattern 40, for example, an edge of the upper surface of the metal mask pattern 40, may be covered by the liner 45.

Figure 2C:
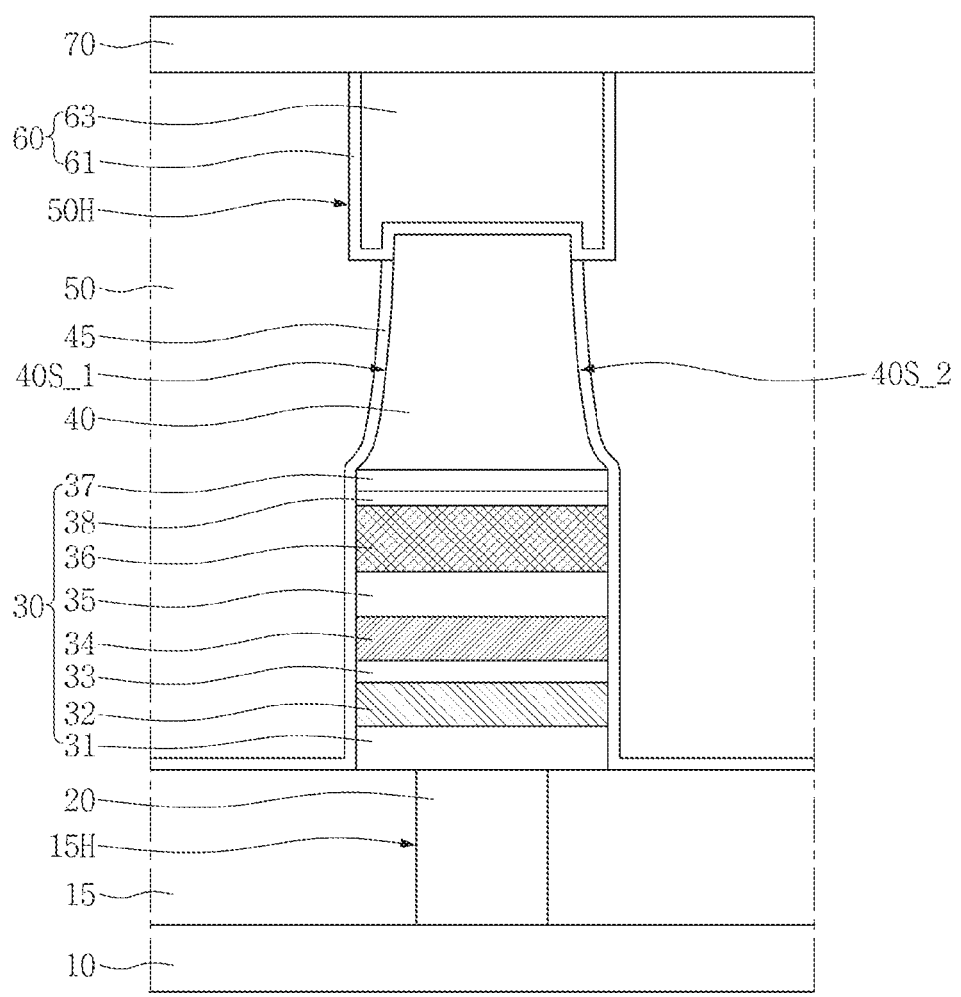

FIG. 2C illustrates a longitudinal cross-sectional view schematically illustrating a MRAM device according to some example embodiments of inventive concepts. In some example embodiments of inventive concepts, detailed descriptions of the same content as those of the above-described embodiments will be omitted.

Referring to FIG. 2C, a MRAM device 100C according to some example embodiments of inventive concepts may further include a metal oxide pattern 38 between a free magnetic pattern 36 and a capping pattern 37. The metal oxide pattern 38 may include tantalum oxide (TaO), titanium oxide (TiO), uranium oxide (UO), barium oxide (BaO), zirconium oxide (ZrO), strontium oxide (SrO), hafnium oxide (HfO), lanthanum oxide (LaO), cerium oxide (CeO), samarium oxide (SmO), magnesium oxide (MgO), thorium oxide (ThO), calcium oxide (CaO), scandium oxide (ScO), yttrium oxide (YO), chromium oxide (CrO), or tungsten oxide (WO).

Figure 3A:
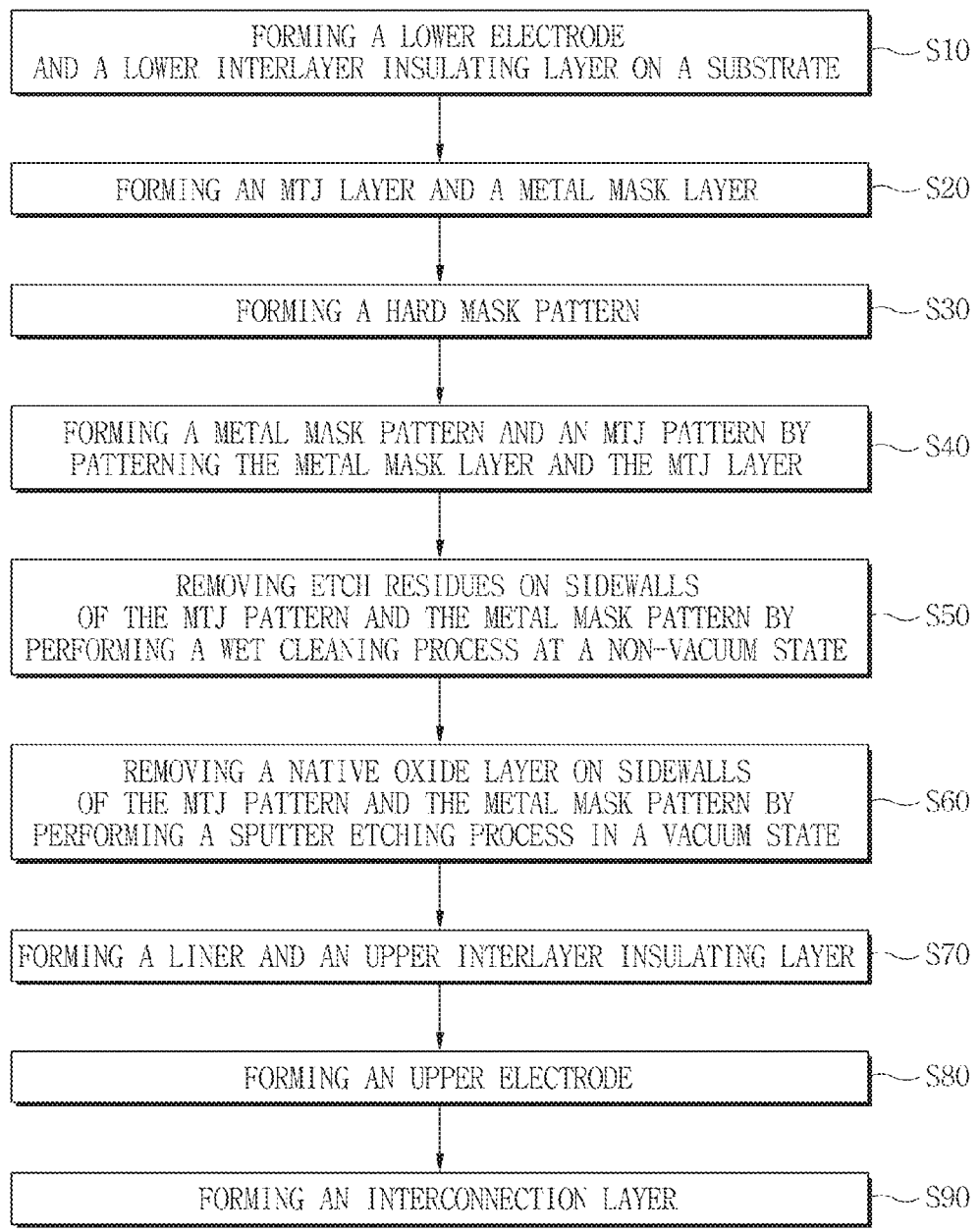
FIG. 3A, FIG. 3B, and FIG. 3C are flowcharts illustrating a method of manufacturing MRAM devices according to some example embodiments of inventive concepts.
Figure 3B:
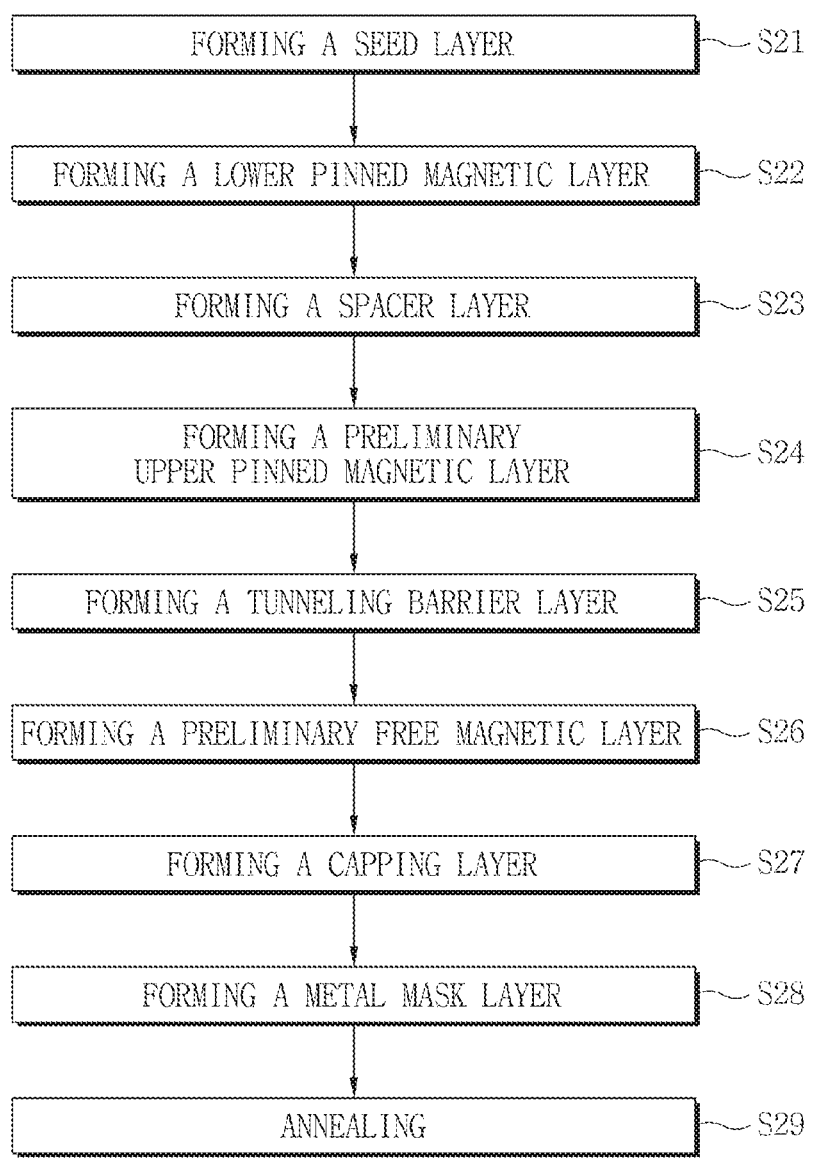
Figure 3C:
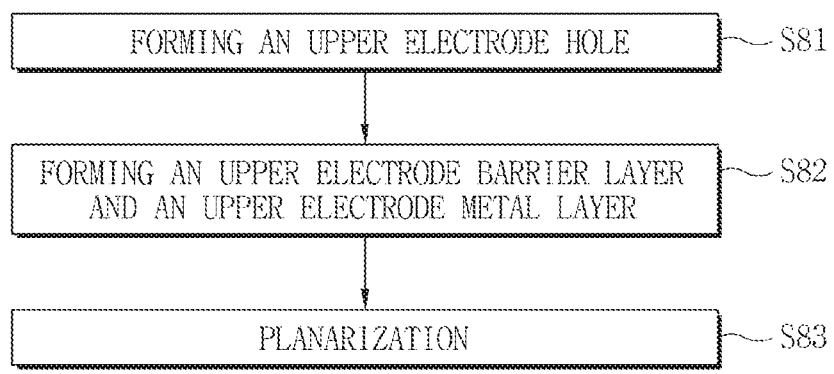

FIG. 3A, FIG. 3B, and FIG. 3C are flowcharts illustrating a method of manufacturing a MRAM device according to some example embodiments of inventive concepts. FIG. 4A, FIG. 4B, FIG. 4C, FIG. 4D, FIG. 4E, FIG. 4F, FIG. 4G, FIG. 4H, FIG. 4I, FIG. 4K, and FIG. 4M are longitudinal cross-sectional views schematically illustrating a method of manufacturing the MRAM device according to some example embodiments of inventive concepts.

Figure 4A:
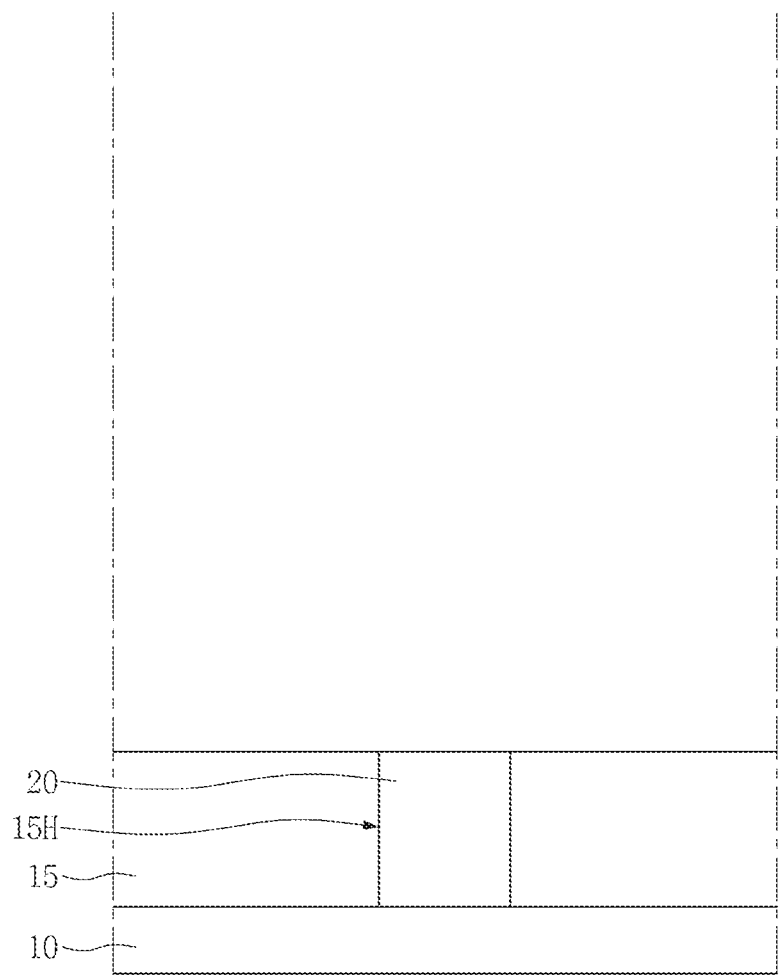
FIG. 4A, FIG. 4B, FIG. 4C, FIG. 4D, FIG. 4E, FIG. 4F, FIG. 4G, FIG. 4H, FIG. 4I, FIG. 4. J.

Referring to FIGS. 3A and 4A, a method of manufacturing a MRAM device 100A according to some example embodiments of inventive concepts may include forming a lower interlayer insulating layer 15 on a substrate 10, forming a lower electrode hole 15H in the lower interlayer insulating layer 15, and forming a lower electrode 20 filling the lower electrode hole 15H (S10).

The substrate 10 may include a silicon wafer, an SOI wafer, or a semiconductor wafer having an epitaxial growth layer formed of silicon germanium (SiGe).

The forming of the lower interlayer insulating layer 15 may include forming an insulating material layer on the substrate 10 by performing a deposition process. The lower interlayer insulating layer 15 may include silicon oxide, silicon nitride, or silicon oxynitride. For example, the lower interlayer insulating layer 15 may include BPSG, TOZE, USG, SOG, a FOX, TEOS, or a HDP oxide. The lower electrode hole 15H may be formed to expose an upper surface of the substrate 10.

The forming of the lower electrode 20 may include forming a lower electrode material layer on the lower interlayer insulating layer 15 to fill the lower electrode hole 15H by performing a deposition process, and removing the lower electrode material layer located on the lower interlayer insulating layer 15 by performing a planarization process including a chemical mechanical polishing (CMP) process. Accordingly, an upper surface of the lower electrode 20 and an upper surface of the lower interlayer insulating layer 15 may be substantially coplanar. The lower electrode 20 may include a conductor including poly-silicon, a metal, a metal alloy, or a metal silicide.

In some example embodiments, the method may further include forming an isolation region defining an active region on the substrate 10, forming a gate structure on the active region, and forming source/drain areas in the active region located at both sides of the gate structure. The isolation region may include a trench and an insulating material filling the trench. The insulating material may include silicon oxide or silicon nitride. The gate structure may include a gate insulating layer directly formed on the substrate 10, a gate electrode on the gate insulating layer, a gate capping layer on the gate electrode, and a gate spacer formed on side surfaces of the gate insulating, the gate electrode, and the gate capping layer. The gate insulating layer may include SiO2, or a metal oxide including HfO. The gate electrode may include a conductor including poly-silicon, a metal, a metal alloy, or a metal silicide. The gate capping layer may include SiN. The gate spacer may include SiN, SiBN, or SiCN. The source/drain areas may include dopants including boron (B), phosphorous (P), and/or arsenic (As).

Further, the method may further include forming a source contact plug connected to the source area and a drain contact plug connected to the drain area, and forming a source interconnection on the source contact plug and a lower electrode pad on the drain contact plug. The lower electrode pad may be connected to the lower electrode 20. The source contact plug and the drain contact plug may each include a conductor including poly-silicon, a metal, a metal alloy, or a metal silicide. The source interconnection and the lower electrode pad may each include a conductor including poly-silicon, a metal, a metal alloy, or a metal silicide. The source interconnection may have a line shape extending in a lateral direction. The lower electrode pad may have a circular shape or a polygonal shape in a top view.

Figure 4B:
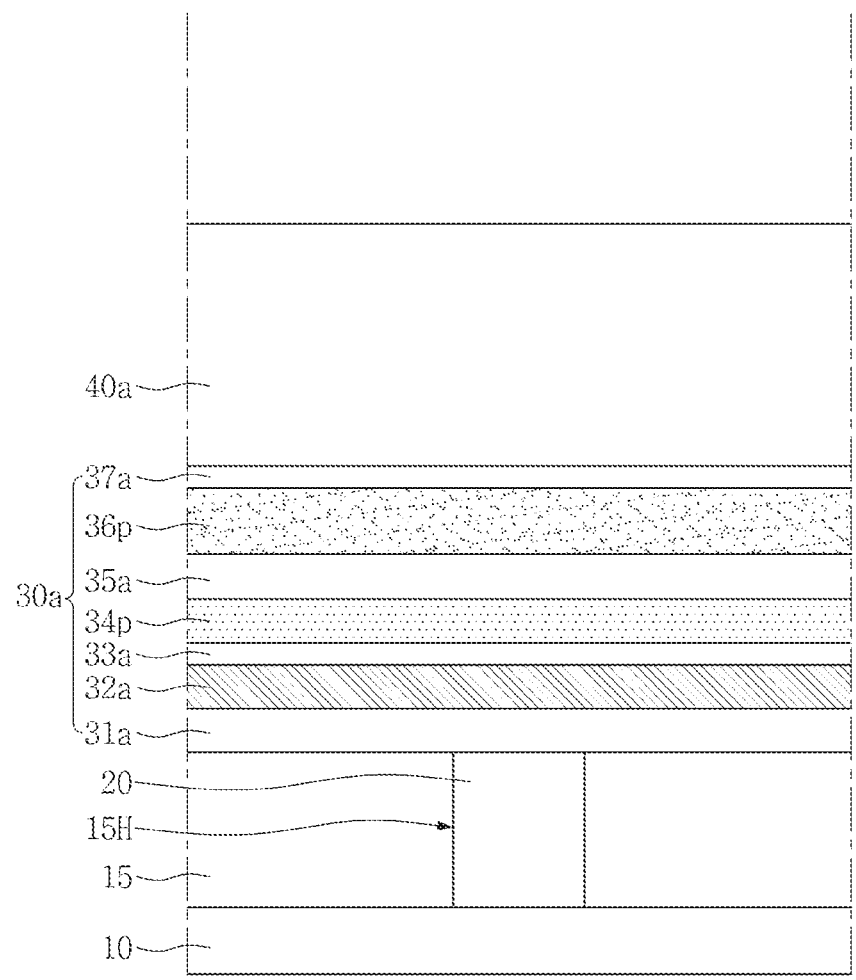

Referring to FIGS. 3A and 4B, the method may include forming an MTJ layer 30a and a metal mask layer 40a sequentially stacked on the lower interlayer insulating layer 15 and the lower electrode 20 (S20).

Figure 4C:
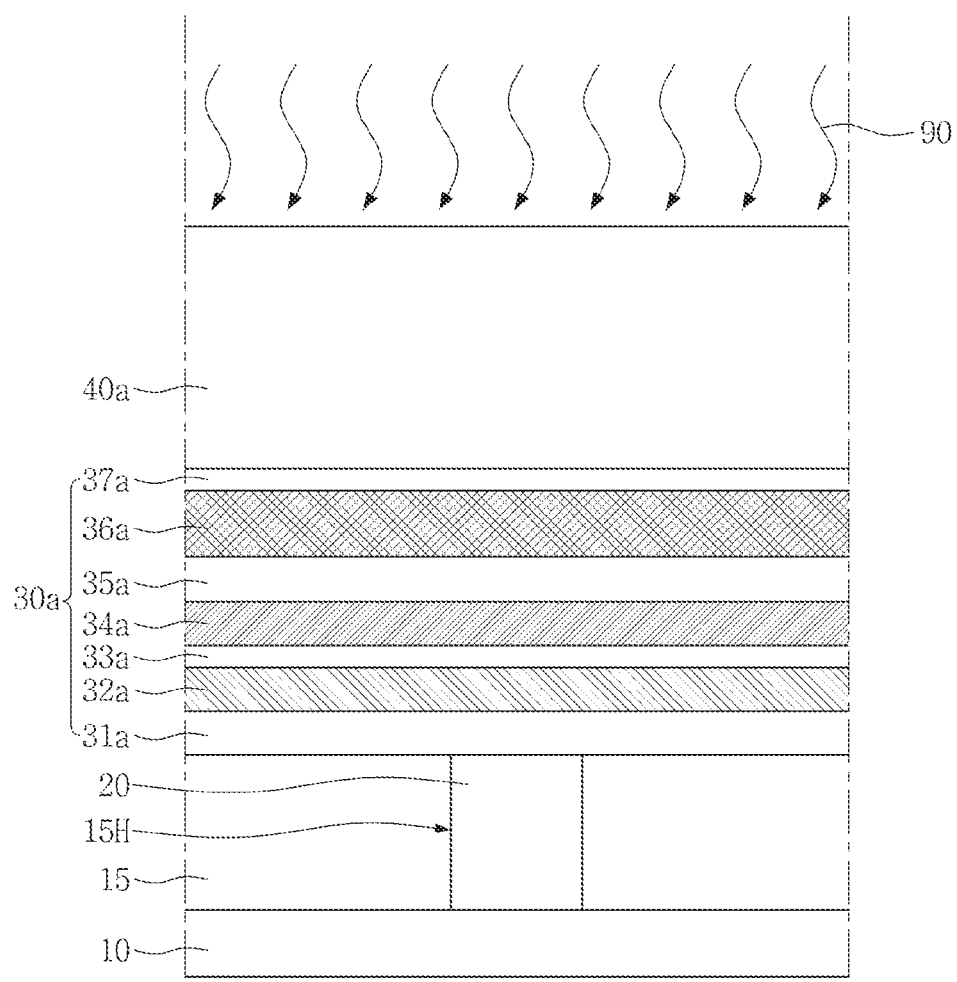

Referring to FIGS. 3B, 4B and 4C, the forming of the MTJ layer 30a and the metal mask layer 40a may include forming a seed layer 31a on the lower interlayer insulating layer 15 and the lower electrode 20 (S21), forming a lower pinned magnetic layer 32a on the seed layer 31a (S22), forming a spacer layer 33a on the lower pinned magnetic layer 32a (S23), forming a preliminary upper pinned magnetic layer 34p on the spacer layer 33a (S24), forming a tunneling barrier layer 35a on the preliminary upper pinned magnetic layer 34p (S25), forming a preliminary free magnetic layer 36p on the tunneling barrier layer 35a (S26), forming a capping layer 37a on the preliminary free magnetic layer 36p (S27), forming the metal mask layer 40a on the capping layer 37a (S28), and forming an upper pinned magnetic layer 34a and a free magnetic layer 36a by crystallizing the preliminary upper pinned magnetic layer 34p and the preliminary free magnetic layer 36p by performing an annealing process (S29). Performing an annealing process may include applying heat 90 to one or more layers of the MTJ layer 30a to anneal the one or more layers. For example, performing an annealing process may include applying heat to at least the upper pinned magnetic layer 34a and the free magnetic layer 36p, as shown in FIG. 4C. Such an application of heat may be referred to as annealing the one or more layers. In this process, the MTJ layer 30a including the seed layer 31a, the lower pinned magnetic layer 32a, the spacer layer 33a, the upper pinned magnetic layer 34a, the tunneling barrier layer 35a, the free magnetic layer 36a, and the capping layer 37a may be formed.

The seed layer 31a may include Ta and/or Ru. The seed layer 31a may provide a crystallizability or crystal orientation of the lower pinned magnetic layer 32a. The seed layer 31a may be a single layer or bilayer. For example, the seed layer 31a may be a single layer having Ta or Ru, or formed as a bilayer having a lower Ta layer and an upper Ru layer stacked on the lower Ta layer.

The lower pinned magnetic layer 32a may include a CoPt layer, a CoPd layer, an alloy layer of CoPt and CoPd, or a multilayer in which CoPt layers and CoPd layers are alternately stacked.

The spacer layer 33a may include an anti-ferromagnetic metal including Ru.

The preliminary upper pinned magnetic layer 34p may include a CoFe-based amorphous material layer. For example, the preliminary upper pinned magnetic layer 34p may include CoFeB. In some example embodiments, the preliminary upper pinned magnetic layer 34p may include a multilayer including a stacked layer of CoFeB/Ta/CoFeB. In some example embodiments, the preliminary upper pinned magnetic layer 34p may include a multilayer including a stacked layer of Co/B/CoFeB or a layer of Co/W/CoFeB/W/CoFeB.

The seed layer 31a, the lower pinned magnetic layer 32a, the spacer layer 33a, and the preliminary upper pinned magnetic layer 34p may be formed by performing a physical vapor deposition (PVD) process including a sputtering process.

The tunneling barrier layer 35a may include MgO. The forming of the tunneling barrier layer 35a may include forming an Mg layer on the preliminary upper pinned magnetic layer 34p by performing a deposition process, and oxidizing the Mg layer by performing an oxidation process.

The preliminary free magnetic layer 36p may include a CoFe-based amorphous material layer. For example, the preliminary free magnetic layer 36p may include a CoFeB layer or a stacked layer of CoFeB/W/CoFeB. The preliminary free magnetic layer 36p may be formed by performing a PVD process including a sputtering process.

The capping layer 37a may include a metal including Cu, Ta, Al, Au, Ti, or Ru, or a metal nitride including TiN or TaN. For example, the capping layer 37a may include Ru. The capping layer 37a may be formed by performing a PVD process including a sputtering process.

The metal mask layer 40a may include a metal or a metal nitride. For example, the metal mask layer 40a may include W, Ta, Ti, Ru, or TiN.

In some example embodiments, the method may further include forming a metal oxide layer between the preliminary free magnetic layer 36p and the capping layer 37a. The metal oxide layer may include TaO, TiO, UO, BaO, ZrO, SrO, HfO, LaO, CeO, SmO, MgO, ThO, CaO, ScO, YO, CrO, or WO. Hereinafter, the MRAM 100C shown in FIG. 2C may be formed by performing processes described with reference to FIGS. 4D to 4M.

Figure 4D:
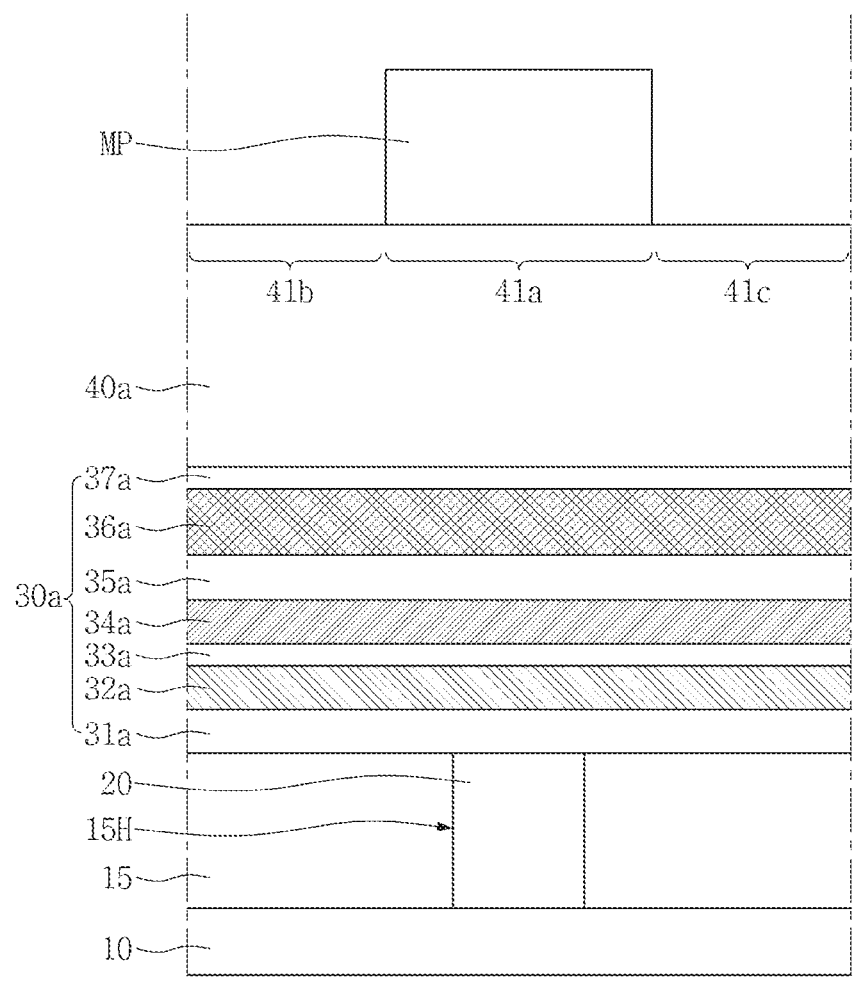

Referring to FIGS. 3A and 4D, the method may include forming a mask pattern MP on the metal mask layer 40a to selectively expose one or more portions 41b, 41c of an upper surface of the metal mask layer 40a (S30). For example, the mask pattern MP may be formed to cover at least a portion 41a of the upper surface of the metal mask layer 40a, where the portion 41a is a portion of the upper surface of the metal mask layer 40a that vertically overlaps the lower electrode 20, and expose remaining portions 41b, 41c of the upper surface of the metal mask layer 40a. In some example embodiments, the mask pattern MP may be a photoresist pattern. In some example embodiments, the mask pattern MP may be a hard mask pattern including silicon oxide, silicon nitride, or silicon oxynitride.

Figure 4E:
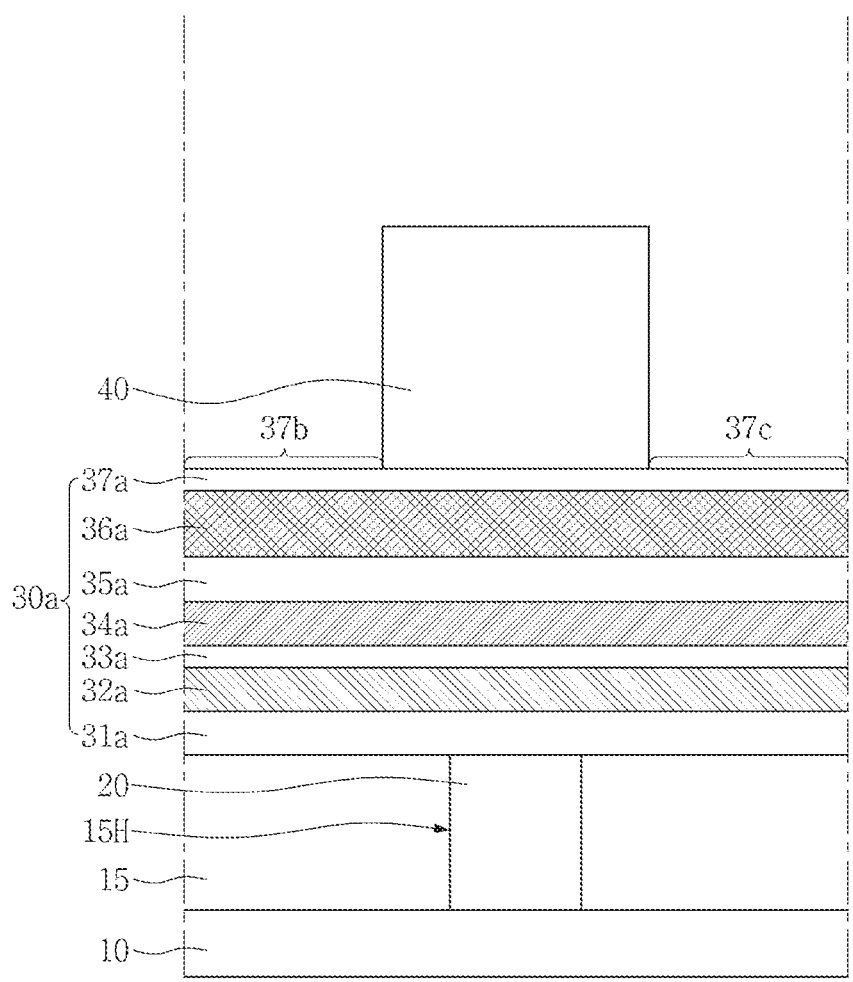

Referring to FIGS. 3A and 4E, the method may include patterning the metal mask layer 40a using the mask pattern MP (see FIG. 4D) as an etching mask (S40). The patterning of the metal mask layer 40a may be performed using a dry etching process. In this process, the mask pattern MP may be removed. Further, in this process, a portion of the metal mask layer 40a may be selectively removed, based on the mask pattern MP, such that a remaining portion of the metal mask layer 40a is a metal mask pattern 40, and one or more portions 37b, 37c of the capping layer 37a on the MTJ layer 30a are selectively exposed.

Figure 4F:
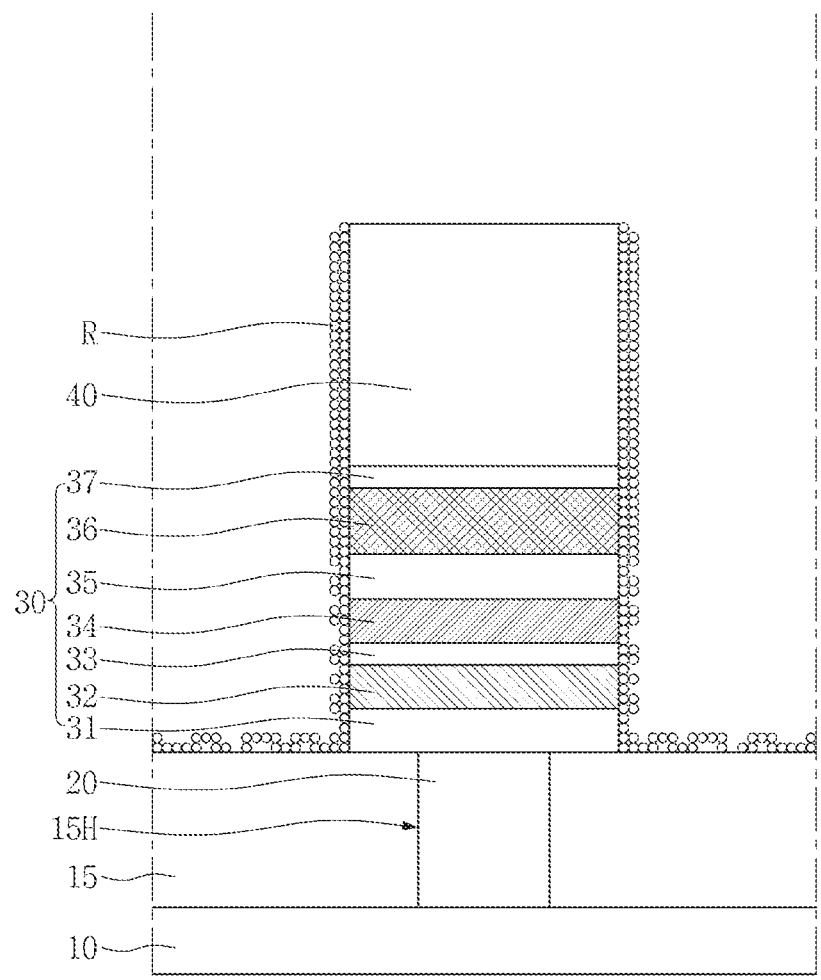

Referring to FIGS. 3A and 4F, the method may include forming an MTJ pattern 30 by patterning the MTJ layer 30a using the metal mask pattern 40 as an etching mask (S40). As shown in FIG. 4F, the patterning may include patterning portions of the MTJ layer 30a exposed relative to the metal mask pattern. The MTJ pattern 30 may include a seed pattern 31, a lower pinned magnetic pattern 32, a spacer pattern 33, an upper pinned magnetic pattern 34, a tunneling barrier pattern 35, a free magnetic pattern 36, and a capping pattern 37. Side surfaces of the metal mask pattern 40 and the MTJ pattern 30 may be vertically aligned.

The patterning of the MTJ layer 30a may be performed using a sputter etching process.

The metal mask pattern 40 and the MTJ pattern 30 include a large amount of metallic material including W, Co, Fe, Mg, Pt, or Pd. As a result, etch rates of an etching process for forming the metal mask pattern 40 and the MTJ pattern 30 are smaller than an etch rate of an etching process of silicon or insulating layer. Further, the etching process for forming the metal mask pattern 40 and the MTJ pattern 30 may generate a large amount of conductive etch by-products. Further, a saturated vapor pressure of the conductive etch by-products is lower than saturated vapor pressure of insulation etch by-products generated when non-metallic materials, including silicon or silicon oxide, are etched. Accordingly, the conductive etch by-products are re-deposited on sidewalls of the metal mask pattern 40 and the MTJ pattern 30. As a result, as shown in FIG. 4F, conductive etch residues R may be generated on the sidewalls of the metal mask pattern 40 and the MTJ pattern 30. At this time, the etch residues R may be also generated on a surface of the lower interlayer insulating layer 15.

Electrical shorts may occur between the upper pinned magnetic pattern 34, the spacer pattern 33, and the lower pinned magnetic pattern 32 disposed under the tunneling barrier pattern 35 and the free magnetic pattern 36 disposed on the tunneling barrier pattern 35 due to the etch residues R generated on sidewalls of the tunneling barrier pattern 35 of the MTJ pattern 30 while the MRAM device 100A is operating.

Meanwhile, a vertical thickness of the metal mask pattern 40 may be greater than a vertical thickness of each of the patterns of the MTJ pattern 40, i.e., a vertical thickness of each of the seed pattern 31, the lower pinned magnetic pattern 32, the spacer pattern 33, the upper pinned magnetic pattern 34, the tunneling barrier pattern 35, the free magnetic pattern 36, and the capping patterns 37. Accordingly, the amounts of conductive elements separated from the metal mask pattern 40 by a sputter etching process may be more than the amounts of conductive elements separated from the MTJ pattern 30 by a sputter etching process. As a result, the etch residues R may include the conductive elements separated from the metal mask pattern 40 as dominant elements. In other words, most of the conductive elements contained in the etch residues R may be the conductive elements contained in the metal mask pattern 40.

In some example embodiments, the processes described with reference to FIG. 4A, FIG. 4B, FIG. 4C, FIG. 4D, FIG. E, and FIG. 4F may be performed in a vacuum state and/or substantially in a vacuum state.

The processes may be performed in a vacuum state and/or substantially in a vacuum state because when the MgO contained in the tunneling barrier pattern 35 is exposed to the atmosphere, the MgO may become MgOH by being hydrated due to H2O contained in the atmosphere. Accordingly, an insulation characteristic of the tunneling barrier pattern 35 is degraded, and thus a magnetic characteristic of the MTJ pattern 30 is degraded. For this reason, the processes for manufacturing the MRAM device are performed in a vacuum state.

As referred to herein, performing a process in any one of a vacuum and/or substantially in a vacuum, in a vacuum state and/or substantially in a vacuum state, etc. refers to performing the process in an environment in which the barometric pressure thereof is less than one (1) Paschal.

As referred to herein, performing a process in any one of a non-vacuum and/or substantially in a non-vacuum, in a non-vacuum state and/or substantially in a non-vacuum state, in an atmosphere, in a presence of an atmosphere, at atmospheric pressure, etc. refers to performing the process in an environment in which the barometric pressure thereof is equal to or greater than one (1) Paschal.

Figure 4G:
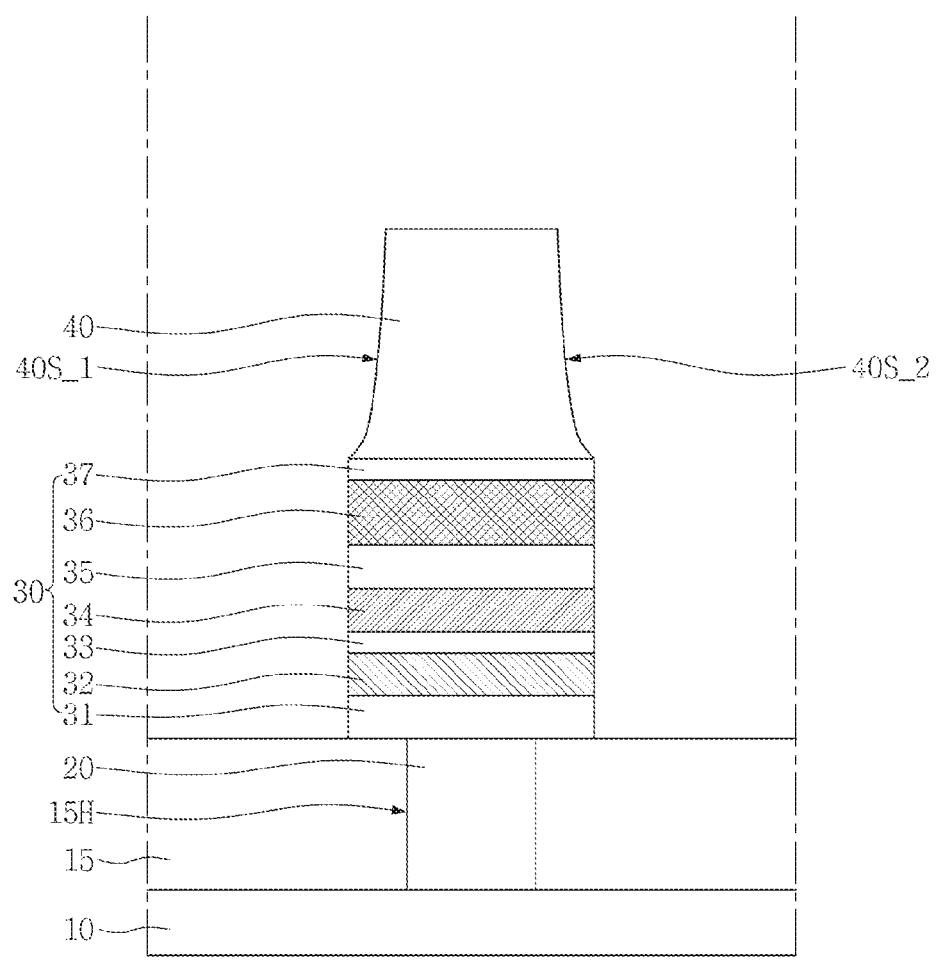

Referring to FIGS. 3A and 4G, the method may include removing the etch residues R by performing a wet cleaning process at a non-vacuum state, i.e., in the presence of an atmosphere, at atmospheric pressure, etc. (S50). The atmosphere may have a barometric pressure that is at ambient atmospheric pressure (i.e., the barometric pressure of the ambient environment) and/or is substantially at ambient atmospheric pressure. In some example embodiments, the atmosphere may have a barometric pressure that is greater than the ambient atmospheric pressure. The wet cleaning process may include applying a cleaning solution to at least the etch residues R. The wet cleaning process may be performed at a temperature of 25 to 80° C. for 30 to 600 seconds.

As described above, the etch residues R may include a relatively large number of the conductive elements contained in the metal mask pattern 40. Accordingly, the cleaning solution may include a composition capable of effectively and/or selectively removing the conductive elements contained in the metal mask pattern 40. In some example embodiments, the cleaning solution may include glycol ether and aliphatic amine. For example, the cleaning solution may include glycol ether of 50 wt % to 99 wt % and aliphatic amine of 1 wt % to 50 wt %, but the present inventive concept is not limited thereto. In some example embodiments, the cleaning solution may include glycol ether and organic alkaline. For example, the cleaning solution may include glycol ether of 50 wt % to 99 wt % and organic alkaline 1 wt % to 50 wt %, but the present inventive concept is not limited thereto.

In some example embodiments, if and/or when the wet cleaning process is performed based on applying a cleaning solution having a selectivity with respect to the conductive elements contained in the metal mask pattern 40, as shown in FIG. 4G, side surfaces of the metal mask pattern 40 may be partially removed. Accordingly, the side surfaces of the metal mask pattern 40, i.e., a first side surface 40S_1 and a second side surface 40S_2 of the metal mask pattern 40, may have curve profiles bent toward an outside thereof. A surface having a curve profile may be understood to have a curvature. A side surface of the metal mask pattern 40 having a curve profile bent toward an exterior thereof may be understood to have a concave curvature towards an exterior of the metal mask pattern. For example, the first side surface 40S_1 of the metal mask pattern 40 may be convex toward the second side surface 40S_2 of the metal mask pattern 40, and the second side surface 40S_2 of the metal mask pattern 40 may be convex toward the first side surface 40S_1 of the metal mask pattern 40. The first side surface 40S_1 and the second side surface 40S_2 of the metal mask pattern 40 may be understood to have concave curvatures towards an exterior of the metal mask pattern 40. Further, lower portions of the first side surface 40S_1 and the second side surface 40S_2 of the metal mask pattern 40 may have a relatively large curvature, and upper portions of the first side surface 40S_1 and the second side surface 40S_2 of the metal mask pattern 40 may have a relatively small curvature. Further, a distance between the first side surface 40S_1 and the second side surface 40S_2 increases in a direction toward the capping pattern 37, and decreases in a direction away from the capping pattern 37. In other words, a horizontal width of the metal mask pattern 40 may decrease in a direction from a lower portion of the metal mask pattern 40 to an upper portion of the metal mask pattern 40.

In some example embodiments, a rinse process and a drying process may further be performed after the wet cleaning process is performed. The rinse process may include applying a rinsing solution to at least one of the MTJ pattern 30 and the metal mask pattern 40. A drying process may include removing one or more solutions from at least one of the MTJ pattern 30 and the metal mask pattern 40. A drying process may include applying one or more fluids to at least one of the MTJ pattern 30 and the metal mask pattern 40 to remove the one or more solutions.

Figure 4H:
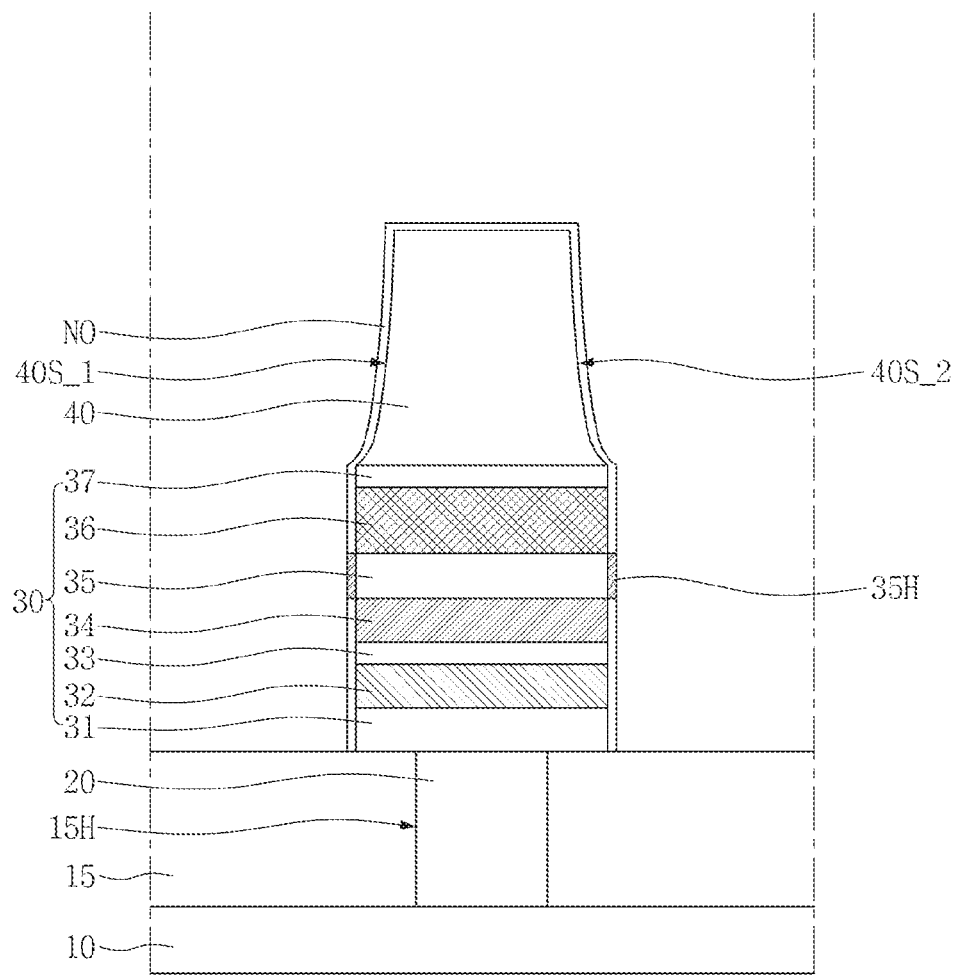

Referring to FIGS. 3A and 4H, if and/or when the at least one of the wet cleaning process and the rinse process are performed at atmospheric pressure, surfaces of the metal mask pattern 40 and the MTJ pattern 30 may be exposed to the atmosphere if and/or when the etch residues R are removed. As a result, a native oxide layer and a hydroxide layer may be formed on the surfaces of the metal mask pattern 40 and the MTJ pattern 30. For example, as shown in FIG. 4H, the native oxide layer NO may be formed on surfaces of the metal mask pattern 40, the capping pattern 37, the free magnetic pattern 36, the upper pinned magnetic pattern 34, the spacer pattern 33, the lower pinned magnetic pattern 32, and the seed pattern 31. The native oxide layer NO may be formed based on at least one of the wet cleaning process and the rinse process being performed at atmospheric pressure. An MgOH layer 35H may be formed on the side surface of the tunneling barrier pattern 35. The MgOH layer 35H on the side surface of the tunneling barrier pattern 35 may be formed based on the rinse process being performed at atmospheric pressure.

Figure 4I:
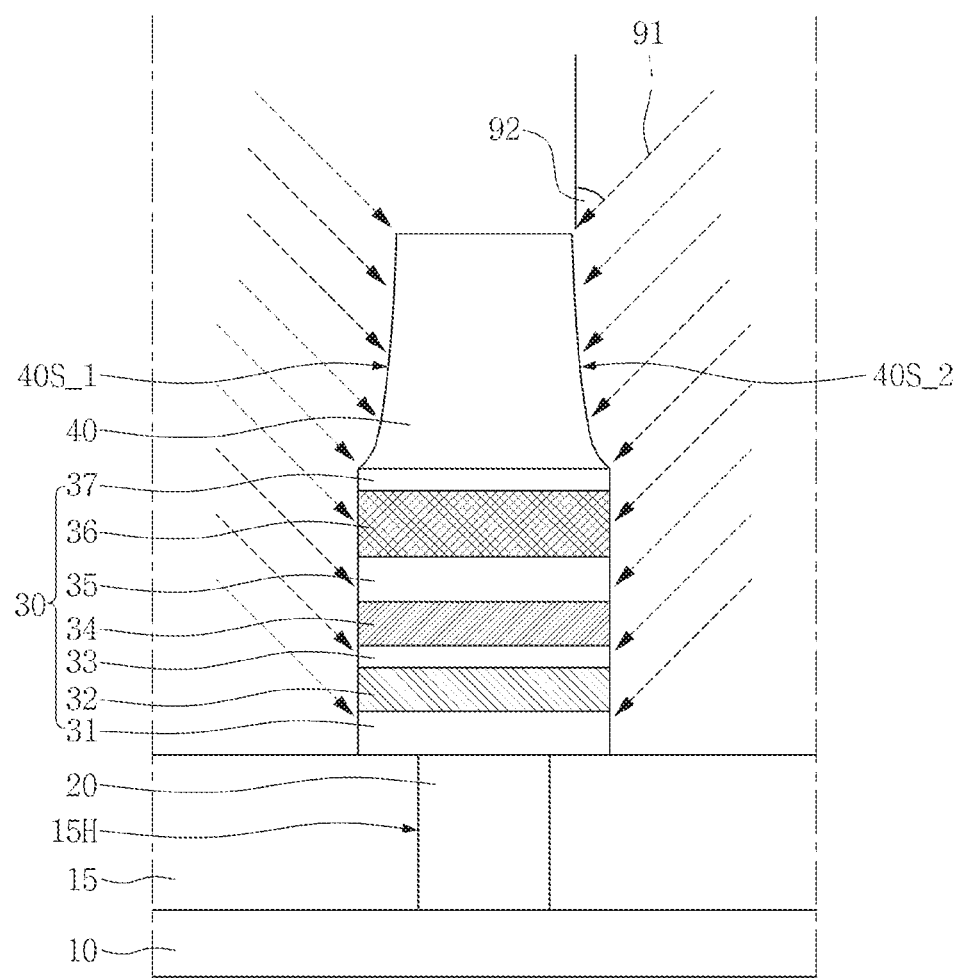

Referring to FIGS. 3A and 4I, the method may include removing the native oxide layer NO (see FIG. 4H) by performing a sputter etching process (S60). In this process, the MgOH layer 35H (see FIG. 4H) on the side surface of the tunneling barrier pattern 35 may be removed.

The sputter etching process may be performed in argon (Ar) or xenon (Xe) gas atmosphere. Further, the sputter etching process may be performed using ion beams 91 having incidence angles 92 of 30 to 90 degrees. Further, the sputter etching process may be performed with a voltage of 50 V to 90 V.

Figure 4J:
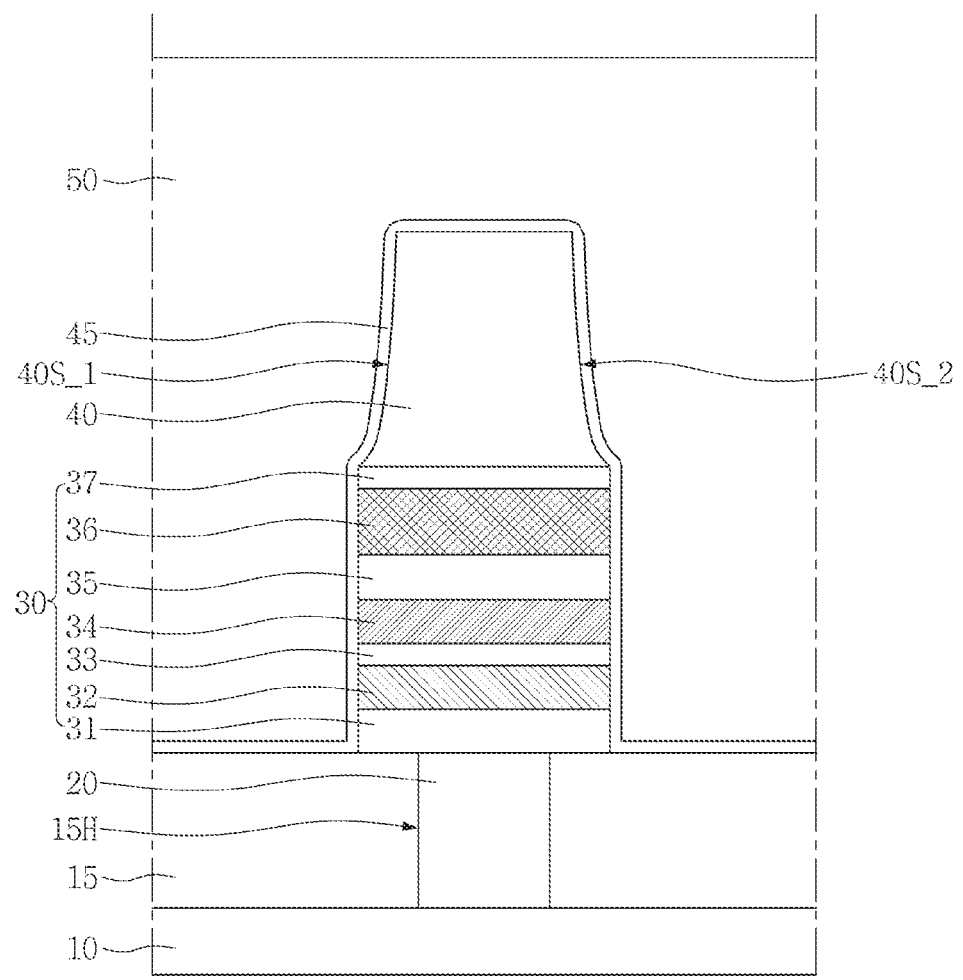
FIG. 4K, FIG. 4L, and FIG. 4M are views schematically illustrating a method of manufacturing MRAM devices according to some example embodiments of inventive concepts.
Figure 4K:
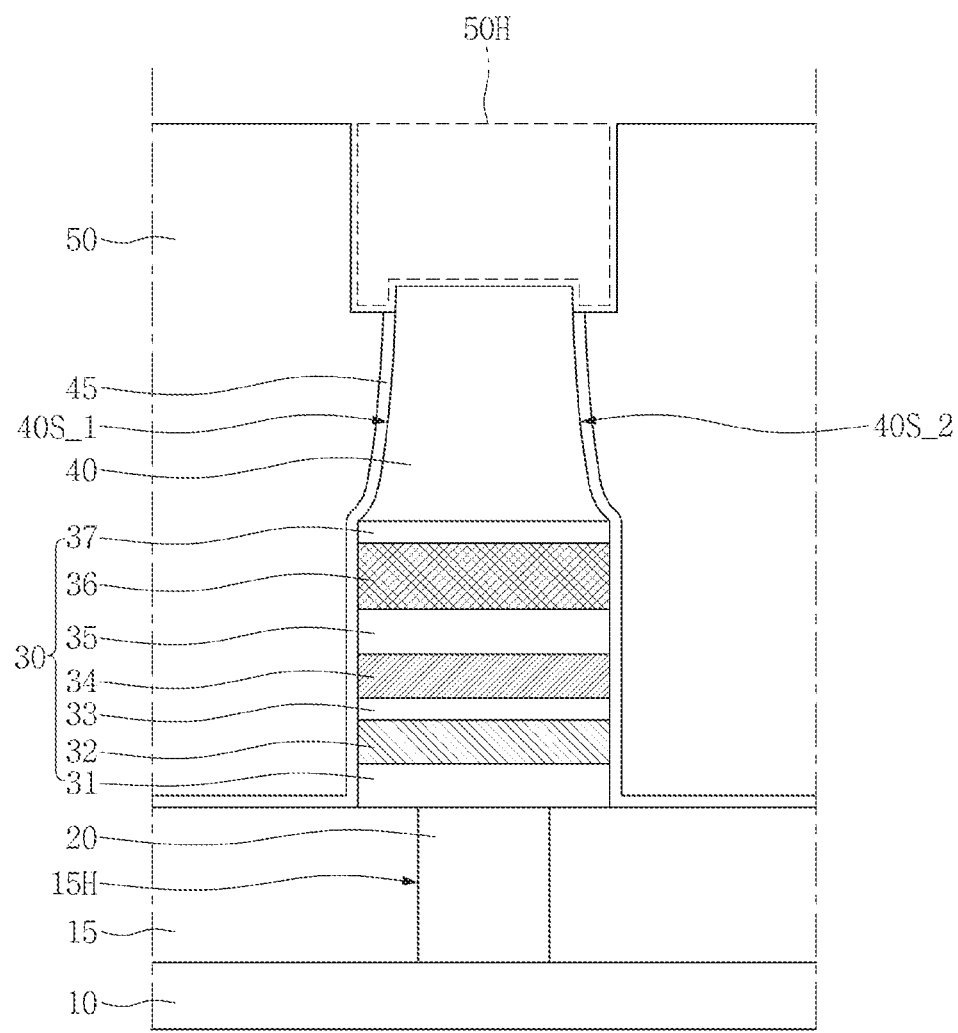
Figure 4L:
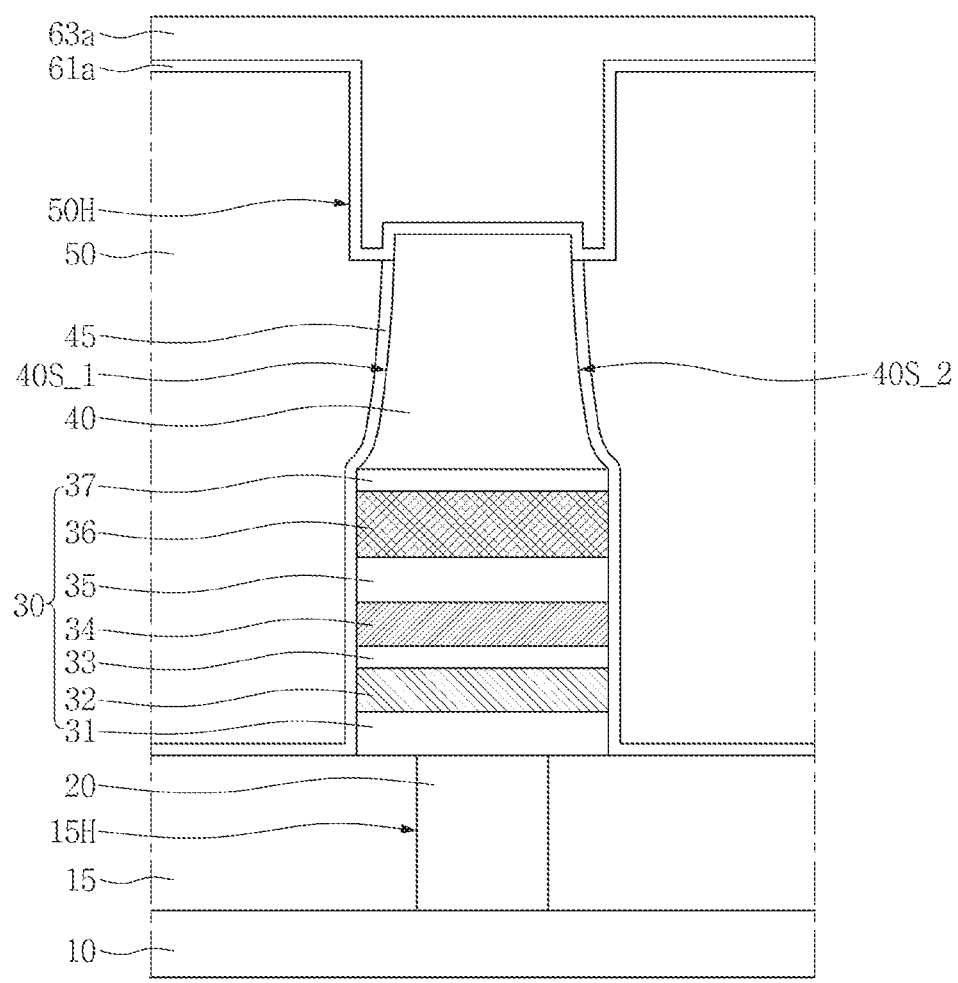

Referring to FIGS. 3A and 4J, the method may include forming a conformal liner 45 on the upper surface of the lower interlayer insulating layer 15, the side surface of the MTJ pattern 30, and the side and upper surfaces of the metal mask pattern 40. The method may further include forming an upper interlayer insulating layer 50 covering the metal mask pattern 40 and the MTJ pattern 30 on the liner 45 (S70). The liner 45 may include silicon oxide, silicon nitride, silicon oxynitride, or a metal oxide including Al2O3. The upper interlayer insulating layer 50 may include silicon oxide or silicon nitride.

Referring to FIG. 3A, the method may include forming an upper electrode 60 (see FIG. 2A) on the metal mask pattern 40 (S80).

Figure 4M:
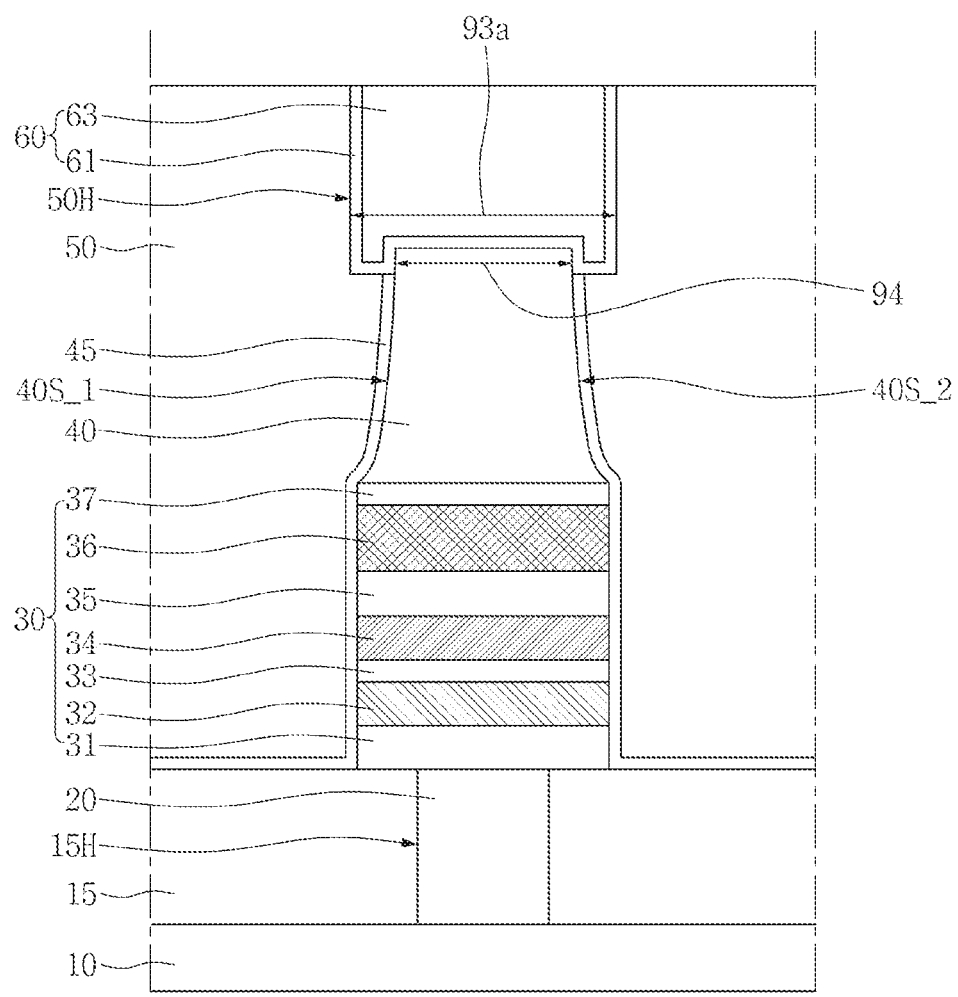

Referring to FIGS. 3C and 4K to 4M, the forming of the upper electrode 60 may include forming an upper electrode hole 50H passing through the upper interlayer insulating layer 50 and the liner 45 and exposing the metal mask pattern 40 (S81), forming a conformal upper electrode barrier layer 61a on inner sidewalls of the upper electrode hole 50H and a surface of the metal mask pattern 40, forming an upper electrode metal layer 63a at least partially filling the upper electrode hole 50H on the upper electrode barrier layer 61a (S82), and forming the upper electrode 60 filling the upper electrode hole 50H by performing a planarization process (S83). As shown in FIG. 4M, the planarization process may include removing at least portions of the electrode barrier layer 61a and the electrode metal layer 63a that are external to the upper electrode hole 50H.

The upper electrode hole 50H may expose the upper surface and a part of the side surfaces of the metal mask pattern 40. The upper electrode hole 50H may expose an upper surface of the liner 45. A horizontal width 93a of the upper electrode hole 50H, also referred to herein as a horizontal width of the upper electrode hole, may be greater than a horizontal width 94 of an upper portion of the metal mask pattern 40, also referred to herein as a horizontal width of the upper electrode hole.

The upper electrode 60 may include an upper electrode barrier pattern 61 and an upper electrode metal pattern 63. An upper surface of the upper electrode 60 may be substantially coplanar with the upper surface of the upper interlayer insulating layer 50. A horizontal width of the upper electrode 60 may be greater than a horizontal width of an upper portion of the metal mask pattern 40. The upper electrode barrier pattern 61 may include Ti, Ta, TiN, TaN, or another barrier metal or a metal compound. The upper electrode metal pattern 63 may include W or Cu.

Referring again to FIGS. 2A and 3A, the method may include forming an interconnection layer 70 on the upper electrode 60 (S90). The interconnection layer 70 may include W or Cu. The interconnection layer 70 may be the bit line BL shown in FIG. 1.

Figure 5A:
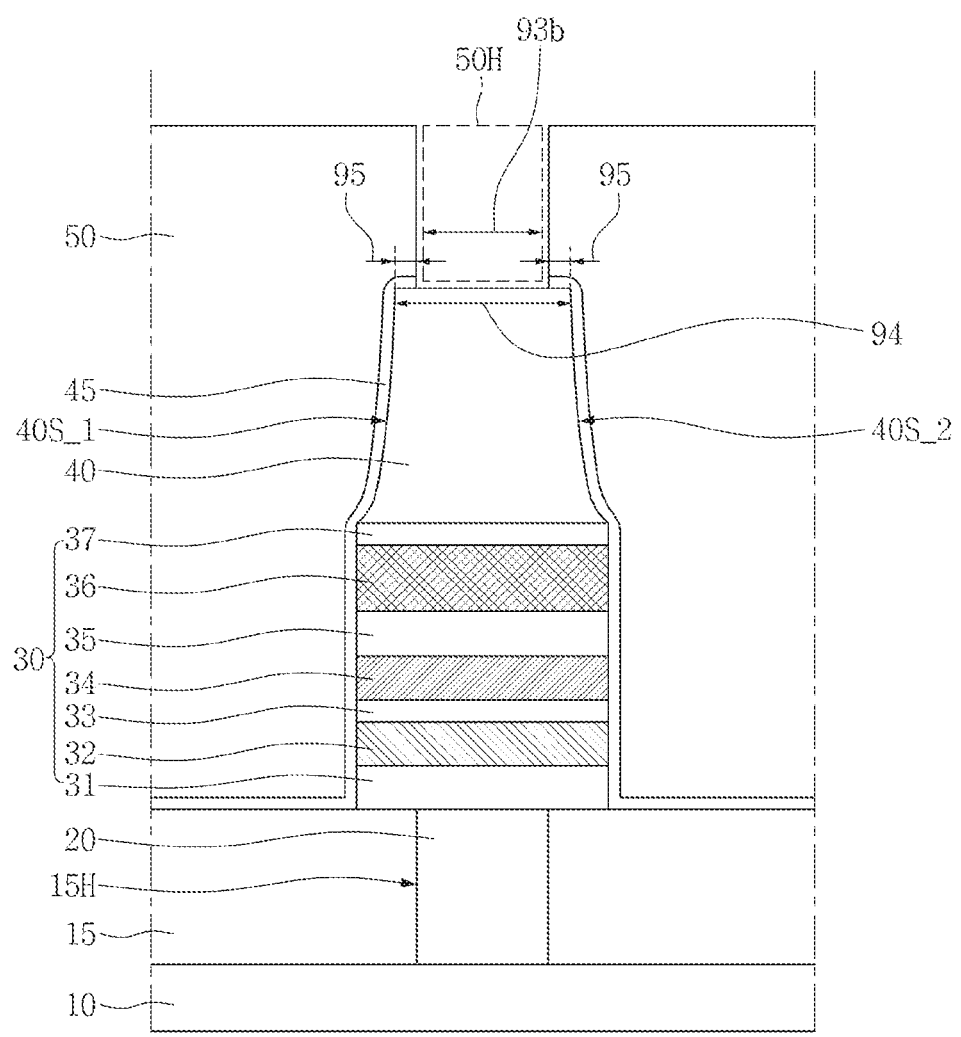
FIG. 5A, FIG. 5B, and FIG. 5C are views schematically illustrating methods of manufacturing MRAM devices according to some example embodiments of inventive concepts.
Figure 5B:
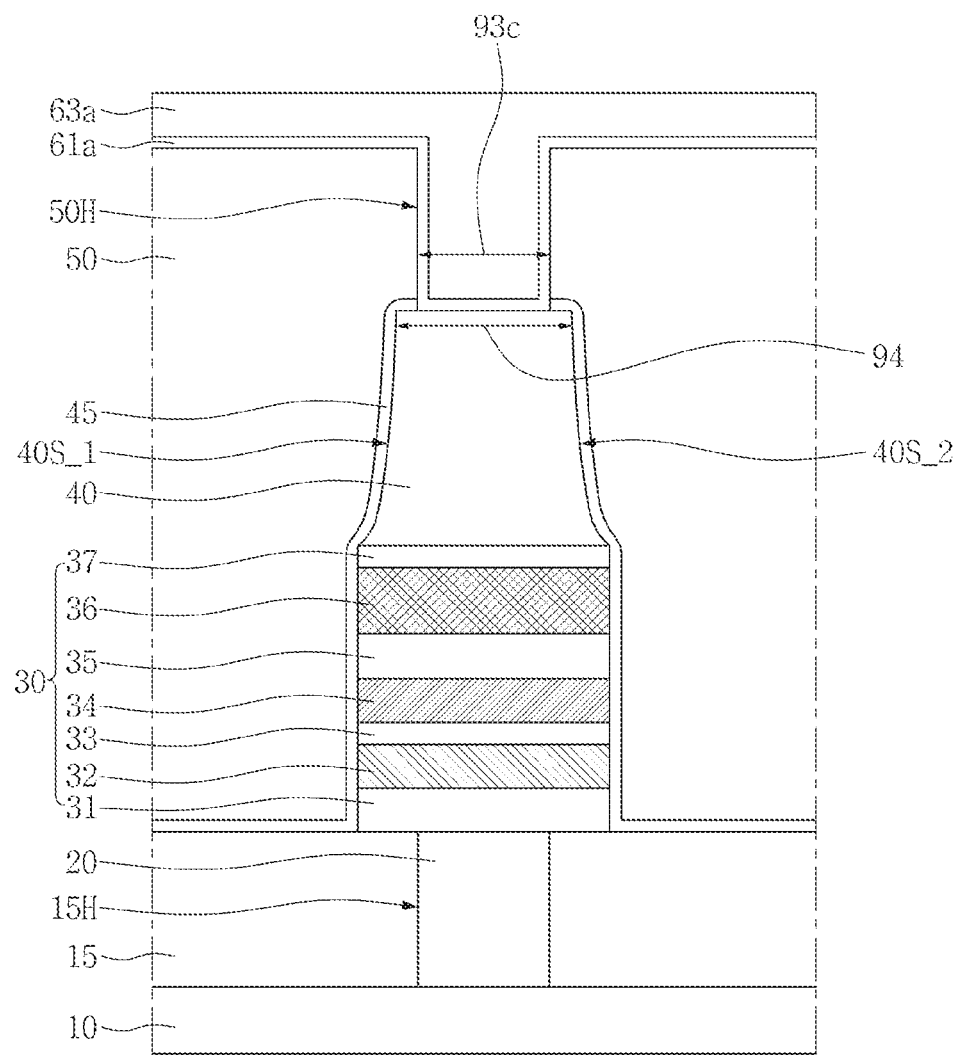
Figure 5C:
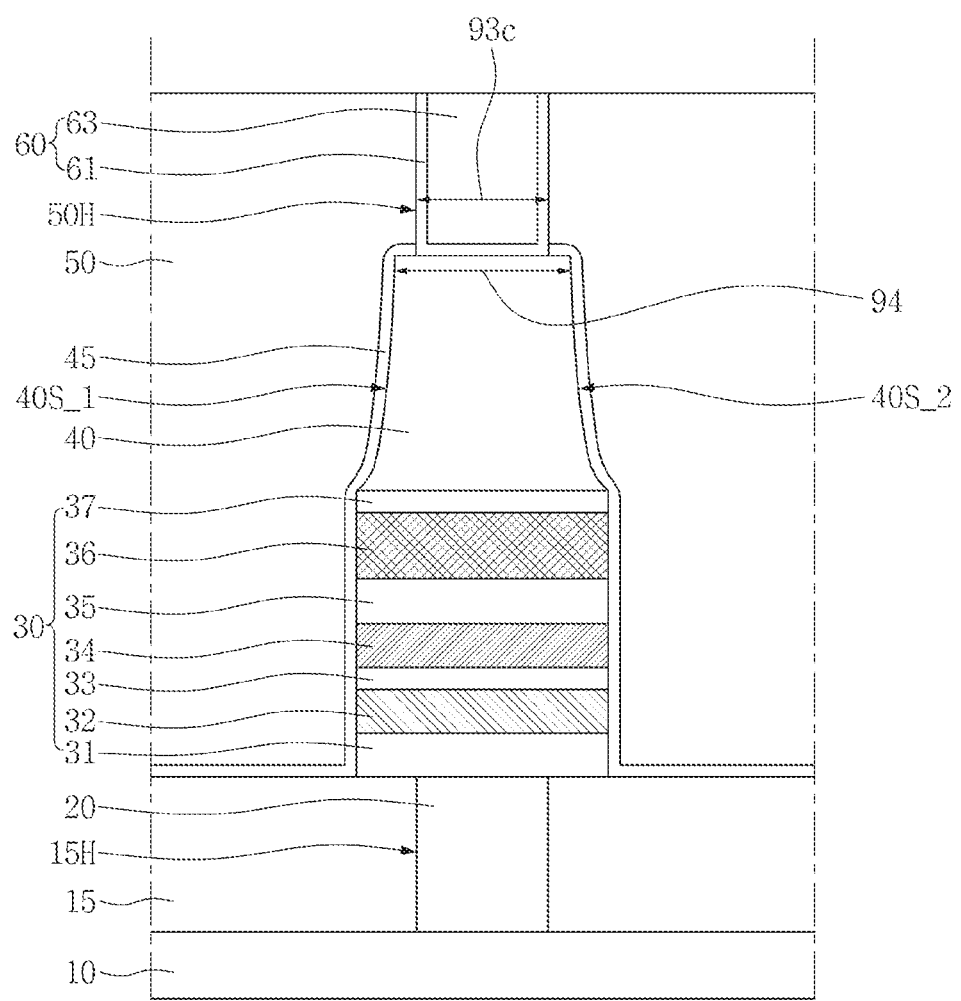

FIG. 5A, FIG. 5B, and FIG. 5C are views schematically illustrating methods of manufacturing MRAM devices according to some example embodiments of inventive concepts. In some example embodiments of inventive concepts, detailed descriptions of the same content as those of the above-described embodiments will be omitted.

Referring to FIG. 5A, a method of manufacturing a MRAM device 100B according to some example embodiments of inventive concepts may include forming an upper electrode hole 50H that extends through an upper interlayer insulating layer 50 and a liner 45 and exposing a metal mask pattern 40 after forming the upper interlayer insulating layer 50 by performing processes described with reference to FIGS. 4A to 4J. A horizontal width 93b of the upper electrode hole 50H may be smaller than a horizontal width 94 of an upper portion of the metal mask pattern 40. Accordingly, a part of the upper surface of the metal mask pattern 40, for example, an edge portion 95 of the upper surface of the metal mask pattern 40, may be covered by the liner 45.

Referring to FIG. 5B, the method may include conformally forming an upper electrode barrier layer 61a on inner sidewalls of the upper electrode hole 50H and a surface of the metal mask pattern 40 and forming an upper electrode metal layer 63a filling the upper electrode hole 50H on the upper electrode barrier layer 61a.

Referring to FIG. 5C, the method may include forming the upper electrode 60 filling the upper electrode hole 50H (see FIG. 5A) by performing a planarization process. A horizontal width 93b of the upper electrode 60 may be smaller than a horizontal width 94 of an upper portion of the metal mask pattern 40. As shown in FIGS. 5A, 5B, and 5C, the horizontal width 93c of the upper electrode 60 may be the same as the horizontal width 93b of the upper electrode hole 50H.

Referring again to FIG. 2A, the method may include forming an interconnection layer 70 on the upper electrode 60.

In the MRAM device according to some example embodiments of inventive concepts, after forming a MTJ pattern, by removing etch residues formed on side surfaces of MTJ pattern by performing a wet cleaning process at atmospheric pressure, electrical shorts of the MTJ pattern may be limited and/or prevented by fully removing the etch residues.

Furthermore, in the MRAM device according to some example embodiments of inventive concepts, by removing an oxide layer formed by performing the wet cleaning process at atmospheric pressure by performing a sputter etching process in a vacuum state, the degradation of an insulation characteristic and the degradation of a magnetic characteristic of the MRAM device may be improved.

Other various effects have been described in the above detailed description.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of manufacturing a magneto-resistance random access memory (MRAM) device, comprising:

forming magnetic tunnel junction (MTJ) layers on a substrate;

patterning the MTJ layers to form a MTJ pattern such that etch residues are formed on a side surface of the MTJ pattern based on the patterning;

removing the etch residues such that an oxide layer is formed on the side surface of the MTJ pattern; and removing the oxide layer based on sputter etching of the MTJ pattern.

2. The method of claim 1, further comprising:
patterning the MTJ layers in a vacuum state; and
removing the etch residues at atmospheric pressure.

3. The method of claim 1, wherein removing the etch residues includes applying a cleaning solution to the side surface of the MTJ pattern.

4. The method of claim 3, wherein the cleaning solution includes
glycol ether and aliphatic amine, or
glycol ether and organic alkaline.

5. The method of claim 1, wherein removing the etch residues includes heating the MTJ pattern to a temperature of about 25° C. to about 80° C. for about 30 second to about 600 seconds.

6. The method of claim 1, further comprising:
removing the oxide layer based on sputter etching of the MTJ pattern in a presence of an atmosphere, the atmosphere including argon (Ar) gas or xenon (Xe) gas.

7. The method of claim 1, further comprising:
patterning the MTJ layers to form the MTJ pattern based on sputter etching the MTJ layers in a vacuum state.

8. The method of claim 1, further comprising:
forming the MTJ pattern in a vacuum state;
wherein forming the MTJ layers includes
forming a seed layer on the substrate;
forming a lower pinned magnetic layer on the seed layer;
forming a spacer layer on the lower pinned magnetic layer;
forming a preliminary upper pinned magnetic layer on the spacer layer;
forming a tunneling barrier layer on the preliminary upper pinned magnetic layer;
forming a preliminary free magnetic layer on the tunneling barrier layer;
forming a capping layer on the preliminary free magnetic layer; and
crystallizing the preliminary upper pinned magnetic layer and the preliminary free magnetic layer based on annealing at least the preliminary upper pinned magnetic layer and the preliminary free magnetic layer.

9. The method of claim 8, wherein the seed layer includes tantalum (Ta) or ruthenium (Ru).

10. The method of claim 8, wherein
the lower pinned magnetic layer includes any one of
a cobalt platinum (CoPt) layer,
a cobalt palladium (CoPd) layer,
an alloy layer of cobalt platinum (CoPt) and cobalt palladium (CoPd), and
a multilayer, the multilayer including a stack of layers, the stack of layers including a cobalt platinum (CoPt) layer and a cobalt palladium (CoPd) layer.

11. The method of claim 8, wherein the spacer layer includes ruthenium (Ru).

12. The method of claim 1, further comprising:
subsequently to removing the oxide layer,
forming a conformal liner covering one or more surfaces of the substrate and the MTJ pattern; and forming an upper interlayer insulating layer on the conformal liner.

13. A method of manufacturing a magneto-resistance random access memory (MRAM) device, comprising:
forming a lower electrode and a lower interlayer insulating layer on a substrate, the lower interlayer insulating layer surrounding a side surface of the lower electrode;
forming magnetic tunnel junction (MTJ) layers and a metal mask layer on the lower electrode and the lower interlayer insulating layer;
patterning the metal mask layer to form a metal mask pattern;
selectively etching the MTJ layers to form a magnetic tunnel junction (MTJ) pattern in a vacuum state based on sputter etching of the MTJ layers such that
etch residues are formed on one or more surfaces of the MTJ pattern and the metal mask pattern, and
at least one upper surface of the lower interlayer insulating layer is exposed;
removing the etch residues based on applying a cleaning solution to the MTJ pattern at atmospheric pressure such that an oxide layer and a hydroxide layer are formed on the one or more surfaces of the MTJ pattern and the metal mask pattern;
removing the oxide layer and the hydroxide layer based on sputter etching the MTJ pattern in the vacuum state;
forming a conformal liner on the at least one upper surface of the lower interlayer insulating layer that is exposed, a side surface of the MTJ pattern, a side surface of the metal mask pattern, and an upper surface of the metal mask pattern;
forming an upper interlayer insulating layer on the conformal liner; and
forming an upper electrode on the metal mask pattern, the upper electrode extending through the upper interlayer insulating layer.

14. The method of claim 13, wherein
forming the upper electrode includes
forming an upper electrode hole in the upper interlayer insulating layer and the conformal liner such that the upper electrode hole exposes the upper surface of the metal mask pattern, the upper electrode hole including a bottom surface and an inner sidewall;
forming a conformal upper electrode barrier layer on the bottom surface of the upper electrode hole, the inner sidewall of the upper electrode hole, and the upper interlayer insulating layer;
forming an upper electrode metal layer on the conformal upper electrode barrier layer; and
removing a portion of the upper electrode metal layer and the conformal upper electrode barrier layer located on the upper interlayer insulating layer and external to the upper electrode hole according to a planarization process.

15. The method of claim 14, wherein
the upper electrode hole has a horizontal width and the metal mask pattern has a horizontal width, the horizontal width of the upper electrode hole being greater than the horizontal width of the metal mask pattern;
the upper surface of the metal mask pattern is exposed through the bottom surface of the upper electrode hole;
a part of the side surface of the metal mask pattern is exposed through the bottom surface of the upper electrode hole;
an upper surface of the conformal liner is exposed through the bottom surface of the upper electrode hole; and the upper surface of the metal mask pattern is elevated over the upper surface of the conformal liner.

16. The method of claim 14, wherein:

the upper electrode hole has a horizontal width and the metal mask pattern has a horizontal width, the horizontal width of the upper electrode hole being smaller than a horizontal width of the metal mask pattern; and the upper surface of the metal mask pattern includes an edge portion, the edge portion being covered by the conformal liner.

17. A method of manufacturing a magneto-resistance random access memory (MRAM) device, comprising:

applying a cleaning solution to a magnetic tunnel junction (MTJ) pattern in a presence of an atmosphere to remove an etch residue from a side surface of the MTJ pattern such that an oxide layer is formed on the side surface of the MTJ pattern; and patterning the MTJ pattern to remove the oxide layer from the side surface of the MTJ pattern.

18. The method of claim 17, further comprising:

heating the MTJ pattern concurrently with applying the cleaning solution to the MTJ pattern, the heating including heating the MTJ pattern to a temperature of about 25° C. to about 80° C. for about 30 second to about 600 seconds.

19. The method of claim 17, further comprising:

patterning the MTJ pattern based on sputter etching of the MTJ pattern in the presence of an atmosphere, the atmosphere including argon (Ar) gas or xenon (Xe) gas.

20. The method of claim 17, further comprising:

forming a conformal liner covering one or more surfaces of the patterned MTJ pattern;

forming an upper interlayer insulating layer on the conformal liner; and forming an upper electrode on the patterned MTJ pattern, the upper electrode extending through the upper interlayer insulating layer.

* * * * *